United States Patent
Li

(10) Patent No.: US 6,286,206 B1
(45) Date of Patent: *Sep. 11, 2001

(54) HEAT-RESISTANT ELECTRONIC SYSTEMS AND CIRCUIT BOARDS

(76) Inventor: Chou H. Li, 8001 Sailboat Key Blvd., Unit 404, South Pasadena, FL (US) 33707

(*) Notice: Subject to any disclaimer, the term of this patent is extended or adjusted under 35 U.S.C. 154(b) by 0 days.

This patent is subject to a terminal disclaimer.

(21) Appl. No.: 09/053,741

(22) Filed: Apr. 2, 1998

Related U.S. Application Data

(63) Continuation-in-part of application No. 08/947,308, filed on Oct. 8, 1997, now Pat. No. 5,937,574, which is a continuation-in-part of application No. 08/805,535, filed on Feb. 25, 1997, now Pat. No. 5,932,348.

(51) Int. Cl.[7] .................................................... H05K 3/32
(52) U.S. Cl. ............................ 29/840; 29/832; 29/852; 29/846; 156/283; 427/96
(58) Field of Search ......................... 156/283; 427/96; 29/840, 846, 839, 740, 830, 831, 852, 832

(56) References Cited

U.S. PATENT DOCUMENTS

| | | | |
|---|---|---|---|
| 2,163,407 | 6/1939 | Pulfrich | 18/59 |
| 2,570,248 | 10/1951 | Kelley | 29/179.5 |
| 2,667,432 | 1/1954 | Nolte | 117/123 |
| 2,708,787 | 5/1955 | Chick et al. | 29/473.1 |
| 3,215,555 | 11/1965 | Krey | 117/123 |
| 3,281,309 | 10/1966 | Ross | 161/196 |
| 3,428,846 | 2/1969 | Rigden et al. | 313/284 |
| 3,448,319 | 6/1969 | Louden | 313/221 |
| 3,452,310 | 6/1969 | Israelson | 335/286 |
| 3,574,579 | 4/1971 | Clarke | 51/307 |
| 3,650,714 | 3/1972 | Farkas | 51/295 |
| 3,740,822 | 6/1973 | Singleton | 29/419 |
| 3,753,758 | 8/1973 | Shanley | 117/25 |
| 3,777,220 | 12/1973 | Tatusko et al. | |
| 3,901,772 | 8/1975 | Guillotin et al. | 204/16 |
| 3,915,369 | 10/1975 | Schmidt-Bruecken et al. | 228/194 |
| 3,949,263 | 4/1976 | Harper | 315/3.5 |
| 4,009,027 | 2/1977 | Naidich et al. | 75/154 |
| 4,018,576 | 4/1977 | Lowder et al. | 51/309 |
| 4,075,364 | 2/1978 | Panzera | 427/34 |
| 4,109,031 | 8/1978 | Marscher | 427/191 |
| 4,111,572 | 9/1978 | Noone et al. | 403/28 |
| 4,239,502 | 12/1980 | Slack et al. | 51/295 |
| 4,252,856 | 2/1981 | Sara | 428/408 |
| 4,294,009 | 10/1981 | Quintin et al. | |
| 4,338,380 | 7/1982 | Erickson et al. | 428/594 |
| 4,347,089 | 8/1982 | Loehman | 156/89 |
| 4,348,131 | 9/1982 | Shimanuki et al. | 403/272 |
| 4,372,037 | 2/1983 | Scapple et al. | |
| 4,396,677 | 8/1983 | Intrater et al. | 428/408 |
| 4,404,262 | 9/1983 | Watmough | 428/539 |
| 4,529,836 | 7/1985 | Powers et al. | 174/94 |
| 4,529,857 | 7/1985 | Meek et al. | 219/10.55 M |
| 4,556,389 | 12/1985 | Ueno et al. | 433/206 |
| 4,593,851 | 6/1986 | Skog | 228/248 |
| 4,608,226 | 8/1986 | Lauvinerie et al. | 419/5 |
| 4,624,403 | 11/1986 | Kohno et al. | 228/122 |
| 4,703,884 | 11/1987 | Landingham et al. | 228/122 |
| 4,732,780 | 3/1988 | Mitoff et al. | |

(List continued on next page.)

OTHER PUBLICATIONS

U.S. application No. 08/482,199, Li filed Jun. 8, 1995.
U.S. application No. 08/301,582, Li filed Sep. 7, 1994.
U.S. application No. 08/805,535, Li filed Feb. 25, 1997.
U.S. application No. 08/947,308, Li filed Oct. 8, 1997.

*Primary Examiner*—Lee Young
*Assistant Examiner*—Rick Kiltae Chang

(57) ABSTRACT

Methods of making improved electronic systems and circuits boards, and more specifically to methods of making improved electronic systems and circuits boards using heat-resistant composite materials having superior mechanical, thermal, and electrical properties.

41 Claims, 6 Drawing Sheets

U.S. PATENT DOCUMENTS

| | | | |
|---|---|---|---|
| 4,735,866 | 4/1988 | Moorhead | 428/627 |
| 4,750,914 | 6/1988 | Chikaoka et al. | 51/293 |
| 4,776,862 | 10/1988 | Wiand | 51/293 |
| 4,851,615 | 7/1989 | Butt . | |
| 4,890,783 | 1/1990 | Li et al. . | |
| 4,899,922 | 2/1990 | Slutz et al. | 228/121 |
| 4,924,033 | 5/1990 | Iyogi et al. | 174/259 |
| 4,953,499 | 9/1990 | Anthony et al. | 118/724 |
| 4,958,592 | 9/1990 | Anthony et al. | 118/724 |
| 4,968,326 | 11/1990 | Wiand et al. | 51/293 |
| 4,970,986 | 11/1990 | Anthony et al. | 118/724 |
| 5,022,801 | 6/1991 | Anthony et al. | 408/144 |
| 5,110,579 | 5/1992 | Anthony et al. | 423/446 |
| 5,116,787 | 5/1992 | Dumbaugh, Jr. | 501/66 |
| 5,125,557 | 6/1992 | Tanaka et al. | 228/121 |
| 5,143,523 | 9/1992 | Matarrese | 51/293 |
| 5,161,728 | 11/1992 | Li | 228/124 |
| 5,190,823 | 3/1993 | Anthony et al. | 428/408 |
| 5,230,924 | 7/1993 | Li | 427/229 |
| 5,248,079 | 9/1993 | Li et al. . | |
| 5,273,731 | 12/1993 | Anthony et al. | 423/446 |
| 5,349,922 | 9/1994 | Anthony et al. | 117/204 |
| 5,377,522 | 1/1995 | Anthony et al. | 72/467 |
| 5,392,982 | 2/1995 | Li et al. . | |
| 5,419,276 | 5/1995 | Anthony et al. | 117/86 |
| 5,419,798 | 5/1995 | Anthony et al. | 156/345 |
| 5,424,096 | 6/1995 | Anthony et al. | 427/249 |
| 5,451,430 | 9/1995 | Anthony et al. | 427/122 |
| 5,464,665 | 11/1995 | Anthony et al. | 427/570 |
| 5,481,795 | 1/1996 | Hatakayama et al. . | |
| 5,551,277 | 9/1996 | Anthony et al. | 72/467 |
| 5,573,607 | 11/1996 | Weaver | 148/437 |
| 5,573,985 | 11/1996 | Weaver | 501/96 |
| 5,874,175 | 2/1999 | Li | 428/457 |
| 5,932,348 | 8/1999 | Li | 428/402 |
| 5,937,514 * | 8/1999 | Li | 29/840 |

* cited by examiner

HEAT-RESISTANT ELECTRONIC SYSTEMS AND CIRCUIT BOARDS

CROSS REFERENCE TO RELATED APPLICATION

This is a continuation-in-part of my U.S. applications Ser. No. 08/947,308, filed Oct. 8, 1997 now U.S. Pat. No. 5,937,574, which is a continuation-in-part of my U.S. applications Ser. No. 08/805,535, filed Feb. 25, 1997 now U.S. Pat. No. 5,932,348. I hereby incorporate by reference these two pending applications.

BACKGROUND OF THE INVENTION

1. Field of the Invention

This invention relates to methods of making heat-resistant equipment and systems and more specifically to methods of making a new non-segregating solid-reinforced composite for use in heat-resistant electronic equipment or systems.

2. Description of Related Art

Different industries urgently demand equipment and systems which operate efficiently at high temperatures. Thermal stress often limits component, system, and equipment performance or life. Such industries include: automotive, electronics, aerospace, health, education, communication, defense, and entertainment. In this invention, the electronics industry will be primarily used as an example.

Today's $1 trillion electronics market is the world's largest and most strategically important industry. The industry provides various electronic components for fast computers, satellite communication systems, deep-well drilling equipment, jet engines, gas turbines, and other systems or equipment. The industry also provides critical components for appliances such as cellular phones, computers, instruments, entertainment devices, educational systems, transportation vehicles, and other articles of mass manufacture.

Electronic components or systems are often mechanically attached together or to the systems frame by screwing, bolting, or clamping. Alternately, the components are chemically or metallurgically bonded together by gluing, soldering, brazing, or welding, depending on the operating temperature of the system and equipment. Often the operating temperature is close to the melting or softening point of the component materials or bonding medium (glue, solder, braze, or weldment). Such a high temperature causes rapid thermal and electrical degradation of the bonded region due to creep, fatigue, and other failure modes.

Semiconductor wafers, chips and circuit boards have many metallic layers or lead wires and lines to conduct electricity. The lead wires or lines must be as few in number and as short as possible to reduce electrical resistances. Electrical resistances slow down the speed of electronic systems. These metallic components must also be rigid, strong, fatigue-resistant, creep-resistant, and thermally conductive to help dissipate heat. Excessive heat generation from, for example, electrical resistances, increases the system temperature, reduces the life of transistors, lowers the mechanical strength and creep resistance of metallic components, and degrades chip and system performance.

Various materials of the mechanically or chemically connected components on the electronic system or equipment are always mismatched in coefficients of thermal expansion (CTE). Metals often have CTE's that are over two to over ten times greater than ceramics such as SiC, $Al_2O_3$, $SiB_6$, or even semiconductor silicon; but smaller than those of plastics such as encapsulating epoxy or circuit board substrate. Hence, significant thermal mismatch stresses always arise between the various components materials when the system is thermally cycled over a temperature range, e.g., over 200–250° C., due to in-circuit power on/off switching.

Heat decreases material strength and increases thermal or electrical resistivities of materials. High thermal resistances decrease heat dissipation, increase the operating temperature, and degrade the semiconductor properties. High electrical resistances adversely affect localized heat generation and life, performance and the clock rate of computers. A 10° C. increase in temperature exponentially decreases semiconductor component life and doubles the chemical reaction rate of, e.g., the formation of high-resistance, crack-initiating intermetallic compounds (IMC) in the chemically bonded regions. These inherent material, thermal, electrical, and chemical factors synergistically intensify one another's effect causing run-away failures of the electronic materials, components, systems, and equipment.

In an electrical circuit board or system, one therefore always has to consider the ever-present thermal mismatch stresses due to mismatched CTE's of components materials. When any electronic equipment and system changes in temperature, thermal mismatch stresses are generated between:

1) the semiconductor wafer or chip and the mounting head on which this wafer or chip is mounted;
2) the metallic layers and lead wires and their encapsulating plastic;
3) the metallic layers and lead wires and the bonded metal layers on the through holes of the circuit board substrate; and
4) the circuit board substrate and the mounting frame of the electronic equipment and system.

Thermal design often is the limiting factor for many electronic systems. For example, the heat generated in a 233-MHz Pentium chip presents a formidable problem. This problem must be solved without discarding the existing mother-circuit-board architecture. Yet, Pentium chips with even higher speeds are already in use.

Fundamental physical, chemical, thermal, electrical, and other limitations of current on-chip interconnecting materials are driving the electronics industry to alternative technologies for "wiring" tomorrow's semiconductor wafers and devices. Heat production, high operating temperature, and thermal stress due to materials mismatch in CTE are unavoidable problems. Thermal stress even limits device miniaturization and chip clock rate, as shown below.

In particular, thermal fatigue and reduced performance is a very common failure mode of the tin-lead solder joint in bonded electronic components. The reliability of electronic packaging and on-chip or off-chip requires reducing creep and fatigue failures from temperature fluctuations and in-circuit power on/off switching.

Many factors must be considered in electronic packaging: signal integrity, CTE and thermal mismatch stress, solder particle segregation due to size or composition, solder paste screening, solder reflow and uniformly fine width, solder ball failures, chip packing density, yield, cost, package warpage, electrical and thermal performance, cleaning, rework operation, moisture resistance, assembly processes, flatness, coplanarity, board level reliability, soaring input/output counts, and extremely miniaturized device with multiple metal layers.

Also troublesome are the following soldering defects: voiding, bridging (or short), solder balling and spreading, insufficient solder, misregistration, opens from poor solder wetting or due to warpage from thermal or mechanical stressing.

Accordingly, an object of the present invention is to provide a novel bonding composite to bond together the various electronic components;

A second object of the invention is to provide a novel composite that has substantially non-segregating solid reinforcing elements;

Another object of the invention is to provide improved reinforcing elements which reinforce the composite matrix mechanically, thermally, electrically;

A further object of the invention is to provide improved reinforcing elements which have controlled anisotropic mechanical, thermal, and electrical properties;

Another object of the invention is to provide easily wetted solid reinforcing elements for improved composite performance;

A still another object of the invention is to provide reinforcing elements in tin-lead composites which can withstand many temperatures cycles between −50 to 200° C.;

Yet another object of the invention is to provide advanced processes and composite materials for semiconductor manufacturing;

A further object of the invention is to provide semiconductor processing methods and materials to achieve improved device miniaturization and reliability, conductive line width and height, chip planarity and coplanarity, wafer warpage, mounting, and very high density on-chip and off-chip interconnect including semiconductor packaging and chip to board integration;

A still further object of the invention is to provide improved semiconductor wafer chips, devices, circuit boards, and systems which are smaller, thinner, lighter, faster, more cost-effective, and more reliable than existing ones;

Another object of the invention is to provide new methods and materials to overcome various chemical, mechanical, thermal, electrical, and other problems related to the electronics manufacture;

Yet another object of the invention is to provide 100% dense, voidfree (under 1000× magnification) graded metal-ceramic bonds to withstand temperatures close to the melting of the bonding medium.

SUMMARY OF THE INVENTION

A method of making heat-resistant electronic equipment and system, printed circuit board, and a soldered, brazed, or welded joint includes mixing into a liquid metal matrix with a preselected liquid density, multiple non-segregating solid reinforcing elements. Each of the reinforcing elements has an average density substantially equal to that of liquid metal matrix. This achieves a substantially uniform and stable distribution of these reinforcing elements in the liquid metal matrix. The liquid metal matrix is then frozen, possibly in a casting mold having a preselected internal shape, in a condition to preserve the uniform and stable distribution in the resultant solid composite. Products of the invention in various forms are also disclosed.

BRIEF DESCRIPTION OF THE DRAWINGS

More features and advantages of the present invention will be more fully apparent from the following detailed description of the preferred embodiment, the appended claims, and the accompanying drawing in which:

DETAILED DESCRIPTION OF THE INVENTION

Figure 1:
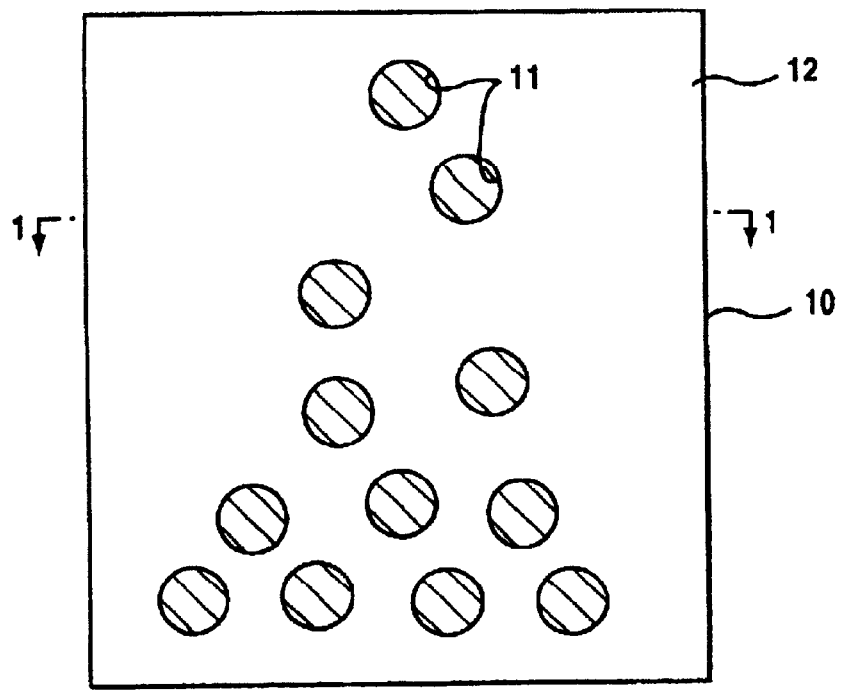
FIG. 1 is a side vertical cross sectional view of a prior-art reinforced composite.

What is needed to solve the above-mentioned electronic packaging problems is a new reinforced bonding composite in which the reinforcing elements (preferably solid reinforcing elements) are uniformly, or substantially uniformly, distributed in a composite matrix. Uniformity in this case means that the concentration of the reinforcing elements per square millimeter, is constant or substantially constant throughout the entire composite. As shown below, the uniform distribution achieves many important benefits beyond mere heat resistance.

Tin-lead solder alloys have been widely used to connect electronic components together. The common eutectic tin-lead solder, i.e., 63% tin-37% lead is weak in heat resistance and thermal fatigue. Composites of the eutectic tin-lead solder having dispersed ceramic reinforcing powders (e.g., SiC) have been tried, without much success.

Sn-Pb soldering alloys melt about 200–300° C. The low melting temperatures simplify the manufacturing process and also permit low-cost plastic circuit boards to be used. Brazing and welding metal alloys melt at temperatures respectively below and above about 800° C. Such high temperatures require ceramic circuit boards. All of the above connections are fusion bonded.

Tin-lead soldered joints are inferior because they have:
 1) high thermal resistance limiting heat spreading;
 2) high electrical resistance reducing circuit component speed and life;
 3) low thermal conductivity magnifying the problems in 1); and
 4) low mechanical strength particularly as to creep, fatigue, or shear, making all the bonded metallic layers or lead wires, the circuit board, or even the entire electronic system non-heat-resistant, short-lived, and unreliable, especially at high temperatures.

Achieving a reinforcing element of comparable density to a matrix material is not a simple task. It was not obvious to the engineer how to provide for improved heat-resistance, and how to fabricate reinforced composites for joining or bonding together various components on electronic circuit boards, systems, and equipment.

The long desired but heretofore unfulfilled need for heat-resistant equipment, electronic circuits and systems is now met by a new method of composite fusion bonding with substantially uniformly and stably distributed solid reinforcing elements. A new composite material is also developed to solve the above chemical, mechanical, thermal, and electrical problems.

Also at least partially alleviated are other difficulties including: device miniaturization and reliability, chip planarity and coplanarity, wafer warpage, mounting, and connecting, semiconductor packaging including very high density on-chip and off-chip interconnection and chip to board integration. This new technology will even make the newly connected wafers, chips, devices, and systems smaller, thinner, lighter, faster, more reliable and cost-effective. This is so even with the rapidly growing wafer sizes and lead counts on the new semiconductor devices, circuit boards, and assemblies.

Composites are important structural materials. A composite results from beneficially combining the unique properties of multiple materials to give useful properties for a specific use. A reinforced composite is formed by adding solid strengthening or reinforcing elements to a liquid composite matrix, followed by solidifying or freezing the liquid mixture or suspension to provide a solidified reinforced composite. The reinforcing elements may be solid or hollow powders, rods, sheets, weaves, or combinations thereof.

A uniform distribution of the reinforcing elements in a composite matrix here means that the concentration of these reinforcing elements in each unit of volume, e.g., cubic millimeter, of the composite matrix is constant, or substantially constant, throughout the entire composite. As shown, a composite has a matrix component forming the majority volume or weight, while the reinforcing elements are the minority. A composite made from 20% by weight of solid reinforcing elements in a matrix of 80%–20% by weight of indium-tin is known as an indium matrix composite.

Ideally, the reinforcing elements should be uniformly distributed in the composite matrix to realize and optimize the desired composite performance. However, this has been extremely difficult, if not impossible, prior to this invention, because of differing densities between the matrix component and the reinforcing elements. The reinforcing elements always sink in a lighter liquid composite matrix, and float in a heavier liquid. The reinforcing elements segregate due to gravity. A non-uniform distribution of the solid reinforcing elements always occurs in the liquid composite matrix. Further, this non-uniform distribution pattern is carried over during the composite matrix solidification, e.g., resin matrix polymerization in a cast mold or lead-tin composite matrix freezing in a soldered joint.

Gravitational segregation is particularly severe at the bottom, top, and edges, or into the corners and narrow or deep spaces always present in the tiny vertical pipe-shaped spaces in printed circuit boards (PCB) next to the electrical lead wires. Nonuniformly distributed or clustered reinforcing elements degrade the strength and heat resistance of, and actually mechanically weaken rather than strengthen, the composite. A composite matrix having too many reinforcing elements is even weaker than a composite matrix itself without any reinforcement. This weakness results as the solid reinforcing elements are not sufficiently supported by or connected to the composite matrix. This causes localized overstress, voids, and cracks in the matrix. Where the reinforcing elements are underpopulated, the composite matrix is, of course, not properly reinforced and, therefore, weak.

The usual reinforcing particles are thermal and electrically insulating ceramic, such as untreated SiC, $Al_2O_3$, or $SiB_6$, powders, and are not properly wetted by the metal composite matrix. This chemical and mechanical decoupling of the reinforcing elements from the composite matrix degrades the quality of the resultant composite. Separated reinforcing elements provide crack-initiating points at the particle-matrix interfaces. The cracked portion has zero strength and infinite electrical and thermal resistance.

The uniform distribution of the reinforcing elements in a liquid or solid composite matrix is critical to composite performance. Proper reinforcement is particularly problematic in cases where a composite is narrow (25–125 microns) and deep, such as between a tube and a concentric cylinder in a narrow-clearance soldered joint on a circuit board. The solder composite here easily initiates premature failures.

The electronic circuit board, system, or equipment usually has a metallic or plastic frame onto which the circuit board substrate is fixedly attached. The attachment inevitably introduces a significant mounting stress at the contact regions. The attachment is done at designated locations, physically by rivetting or metallurgically by fusion bonding. See FIG. 7. The circuit board electrically and physically connects multiple circuit components together.

Figure 7:
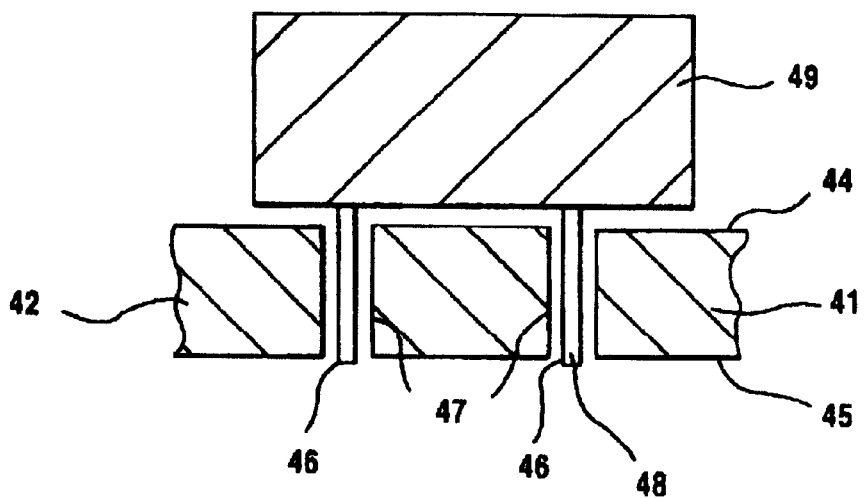
FIG. 7 is an enlarged side cross-sectional view of the electronic system of FIG. 6 showing the relative positions of the circuit components, circuit board substrate, and the electronic system frame and the equipment.

The circuit board substrate has many through holes. Each electronic circuit component has a number of metallic lead wires embedded into and electrically separated by an encapsulant. All the metallic lead wires on each circuit component must extend, and point in a common direction away, i.e., vertically downward as shown in FIG. 7, from the circuit component. In this way, all the extending lead wires can be easily inserted simultaneously into the through holes at the designated locations on the circuit board substrate. The inside surfaces of the through holes are coated with metal layers to facilitate the wetting and bonding of the inserted metallic lead wires.

The solid reinforcing elements are rigid and heat resistant, thus making the composite matrix and entire composite more rigid and heat resistant. This is especially important if the entire electronic system or equipment outside the bonded regions are already rigid and heat resistant. Many other benefits are achieved by the reinforcing composite. For example, the reinforced composite can resist creep, fatigue, and tensile or shear fractures at temperatures close to the melting point of the composite matrix.

The new tin-lead alloy bonding composite for electronic uses contains the usual solder composite matrix, but is uniquely reinforced by stably nonsegregating reinforcing elements suspended or mixed therein. The hard, usually refractory or heat-resistant reinforcing elements are ceramic (or metal) solid or hollow powders, fibers, or more complicated shapes such as special weaved structures. These reinforcing elements improve the creep resistance at temperatures at or near the melting point of the composite matrix. They also improve the thermal, electrical, and other performances of the composite, as shown below.

The composite of the invention has many uses in various industries including electronics, automotive, jet engine, and aerospace. But the invention is described and illustrated most extensively in relation to an electronic application. In particular, electronic packaging including wafer mounting, on-chip and off-chip interconnections, and chip-to-board integrations process will be the preferred embodiment described herein.

The conventional, non-uniformly distributed reinforcing elements, shown in FIG. 1, degrade the performance of a reinforced composite. This figure is a cross-sectional view of a prior-art reinforced composite, denoted as a whole by reference numeral 10. As shown, the prior-art reinforcing elements 11 have a non-uniform distribution in the composite matrix 12, producing an inferior composite.

The heat-resistant ceramic or metal-matrix composite of this invention consists essentially of a ceramic or metal reinforcement substantially uniformly and stably dispersed in a liquid composite metal matrix. Techniques for achieving the substantially uniform and stable distribution of the ceramic reinforcement are described below.

As indicated above, the metal matrix is a bonding metallic material, generally an alloy of multiple fusible soldering, brazing, and welding material. Brazing and welding metallic materials are equally useful for the practice of this invention, and have higher usage temperatures. But the soldering methods and solder alloys are exclusively used as illustrations in this specification.

Due to their low melting points, solder materials have poor high-temperature mechanical properties particularly as to creep, fatigue, and hot tear. The new heat-resistant solider composite has special reinforcing elements stably and uniformly distributed therein. This improved distribution ensures uniform spacing between the reinforcing elements and enhances load transfer among the reinforcing elements through the intervening solder matrix. Even in narrow-clearance soldered joints, the hard and refractory reinforcing elements provide high creep resistance at high temperatures, e.g., near the solder melting point. Such a high temperature normally would fail a non-reinforced solder or a ceramic reinforced composite with non-uniformly distributed reinforcing elements.

For this new solder composite, specially prepared ceramic or metal reinforcing elements are produced to insure a substantially stable and uniform distribution in a liquid solder matrix during the soldering operation. Upon solidification of the liquid solder matrix, a reinforced, solid solder composite is formed in which the uniformly distributed solid reinforcing elements provide the high creep resistance needed.

The unique composite solder has the following benefits:
1) At high temperatures, even near the melting point of the solder matrix, the uniformly distributed, rigid and refractory reinforcing elements prevent uncontrolled creep of the matrix;
2) There are no overcrowded or underpopulated reinforcing elements anywhere in the solder to cause premature matrix failures by hot tear, fracture, or creep of the solder matrix;
3) The new composite solder has reliably uniform, reproducible, and enhanced mechanical properties to withstand high service temperatures normally considered unallowable. The uniformly distributed ceramic reinforcing elements provide improved load transfer properties among themselves;
4) For even better composite performance, the specially prepared ceramic reinforcing elements are specially surface coated with microscopically (i.e., at 1,000 times magnification) pore-free metals of, e.g., Ni, Cr, Ta, W, and Cu, designed to be easily wetted and bonded by the liquid solder for maximum bond strength. Better ceramic wetting produces high densities on the ceramic surface, improves thermal and electrical conductance, and minimizes both surface oxidation of the coated metals and unwanted metals diffusion during the soldering process. See my patent applications Ser. Nos. 08/301,582 and 08/482,199, filed on Sep. 7, 1994 now U.S. Pat. No. 5,674,175 and Jun. 8, 1995, respectively; and
5) The new composite solder can be used on conventional automatic soldering equipment without major modification in the manufacture of heat-resistant printed circuit boards and electronic systems or equipment.

As shown above, a new material and process is urgently needed to eliminate the many serious material and thermal problems. These problems must be immediately solved to eliminate board level redesign while minimizing engineering costs and time-to-market. The solution here involves the custom-design and use of a unique heat-resistant composite in various interconnection processes. The new composite is reinforced by suspended or embedded ceramic, intermetallic, metal, or glass reinforcing solid or hollow powders, rods, sheets, weaves, or combinations thereof. The solid reinforcing elements are rigid and heat-resistant, thereby making the entire composite matrix, and even the entire electronic system or equipment, more rigid and heat resistant. Many other benefits are achieved by the new reinforced composites. For example, reinforced composites can be prepared to resist creep, fatigue, and tensile and shear fractures at temperatures near the melting point of the composite matrix.

With such heat-resistant soldered connects, the metallic lead wire and wafer mounting layer connects are made not only heat and creep resistant, but electrically and thermally conductive to respectively reduce heat generation and dissipate the heat generated. Under these modifications and improvements, the entire electronic circuit board, system, and equipment will become more heat-resistant. This is because other components of the electric circuit board generally have melting points much higher than that of the solder composite.

Through the replacement of the low-melting soldering metal alloys by higher-melting brazing or welding metal alloys, in combination with ceramic, rather than plastic, circuit boards, the products of this invention are made even more heat-resistant.

Figure 6:
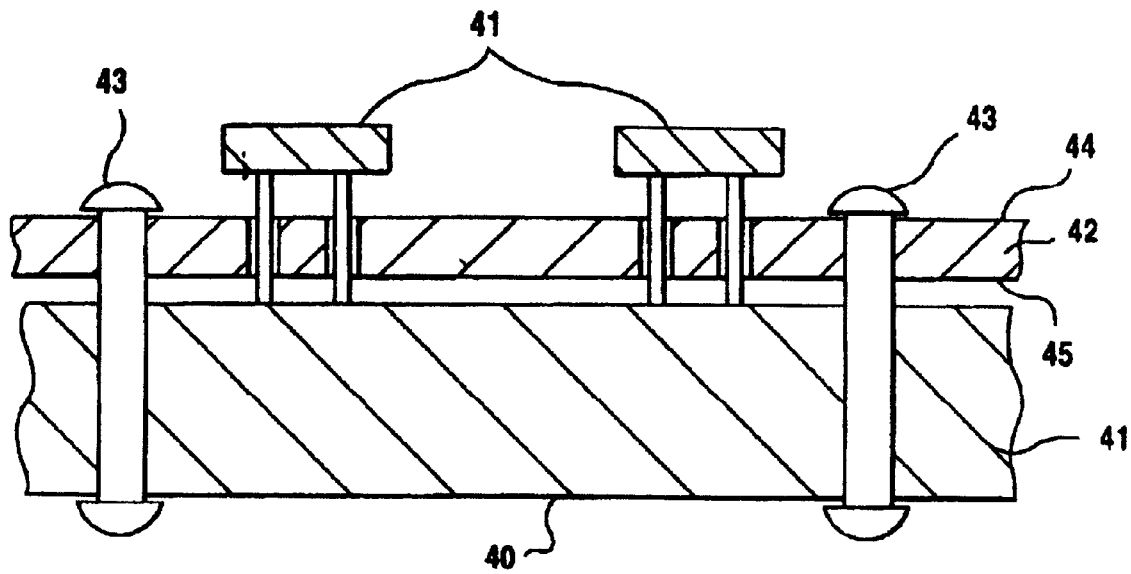
FIG. 6 shows a view of heat-resistant equipment which contains an electronic system.

The method of making heat-resistant equipment is more specifically described below with reference to FIGS. 6 and 7 showing an electronic system or equipment containing a plurality of electronic circuit components 49 mounted on a ceramic or plastic circuit board 42. As shown in FIGS. 6 and 7, the equipment containing the electronic system 40 has a frame 41 onto which a circuit board substrate 42 is fixedly mounted and attached by, e.g., riveting with rivets or bolting with bolts 43 as shown, at specific or designated locations or contacting regions on the frame. The circuit board substrate 42 has a top major surface 44 and a bottom major surface 45; and also has a number of through holes 46 extending from the top major surface to the bottom major surface of the circuit board substrate.

The internal surfaces of the through holes 46 are coated with metallic layers 47 to facilitate their bonding to the electrical lead wires 48 on a fixed number of active or passive circuit components 49. Each of the circuit component has a respective specified number of metallic lead wires 48 which extend, and point in a common direction (i.e., vertically downward) away, from the circuit component. All these lead wires are simultaneously inserted into the selected and plated through holes from the top major surface to at least reach a level of the bottom major surface of the substrate. The remaining spaces in the selected through holes 46 of the substrate 42 are filled with the heat-resistant solid-reinforced solder composite. As shown, this composite has solid ceramic reinforcement substantially uniformly and stably dispersed in its metal matrix. The heat-resistant reinforced composite bonds all the inserted, commonly directed metallic lead wires 48 to the metallic layers 47 coated onto the respective selected through holes 46.

The substantially uniformly and stably dispersed solid ceramic reinforcement in the metal matrix provides heat resistance to the bonded regions at least between the metallic electrical lead wires 48 and the metallic layers 47 coated onto the selected through holes 46, and between the metallic layers in their selected through holes and the circuit board substrate 42. This is so even in the presence of a combination of thermal mismatch stresses between the metallic electrical lead wires, the coated metallic layers in the selected through holes, and the circuit board, and the mounting stress between the circuit board and the system or equipment frame. In this way, the entire system or equipment is made heat-resistant.

All the components of the system, except for the solder composite, can withstand temperatures at least above the melting point of the composite. If the solder composite can be used close to its melting point, the critical solder region is made heat resistant also close to the melting point. The entire circuit, circuit board, electronic or other system, instrument, appliance, or equipment is therefore made similarly heat resistant, since generally the bonded regions have the lowest melting temperatures.

Often, the circuit boards are mounted on a plurality of different frames. The modern automobile or other transportation vehicle, for example, has many circuit boards mounted on different frames respectively for control of the engine, speed, entertainment, steering, brake, noise, and temperature. Circuit boards/frames near the hot engine require brazed joints.

Specifically, the new composite has a liquid composite matrix which has a preselected liquid density and contains a plurality of solid reinforcing elements. Each of the solid reinforcing elements has an inner core material and an outer shell material. The inner core material has a preselected average radius or half thickness $r_1$, a preselected average volume $v_1$, a preselected average density $d_1$, and a preselected average weight $w_1$. The outer shell material has a preselected average radius or half thickness $r_2$, a preselected average volume $v_2$, a preselected average density $d_2$, and a preselected average weight $w_2$. The resulting reinforcing element has an average solid density substantially equal to the preselected liquid density of a liquid composite matrix, i.e., $w_1+w_2=(v_1+v_2) d_m$.

This condition provides a composite having a substantially uniform and stable distribution of the solid reinforcing elements therein. The mixture is then solidified or frozen in a condition to keep the same desired distribution.

Figure 2:
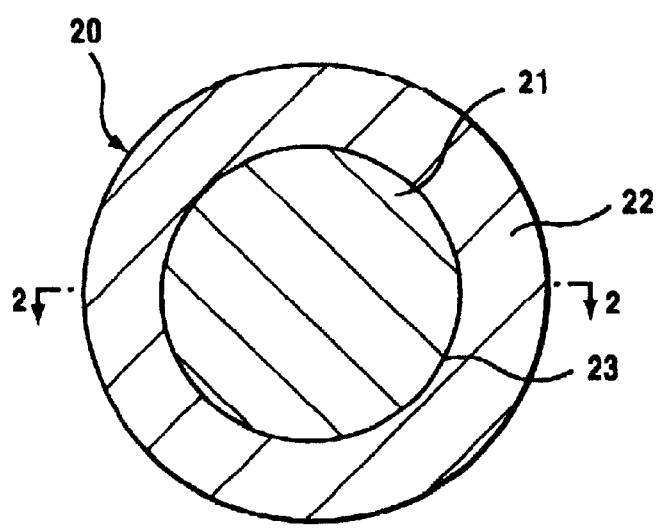
FIG. 2 is a cross-sectional view of a single non-segregating, solid reinforcing sphere of the present invention.

FIG. 2 shows a cross-sectional view of the non-segregating reinforcing elements of the invention and is denoted as a whole by reference numeral 20. As shown, the reinforcing element has an inner core material 21, surrounded by an outer shell material 22. An interface 23 is formed between the inner core material 21 and the outer shell material 22. The reinforcing elements of the present invention are actually microcomposites themselves.

In a preferred embodiment of the present invention an improved composite is formed using solid reinforcing elements which are designed to have the same average density as that of a preselected liquid matrix. This condition minimizes or eliminates gravitational segregation. Since most common reinforcing elements always have densities different from that of composite matrix, reinforcing elements useful in the present invention must have a multi-layered or microcomposite structure to average out the multiple layer densities to a desired value, i.e., that of the liquid composite matrix.

The solid reinforcing element 20 can be a solid or hollow spherical powder, rod, fiber, or cylinder. The reinforcing elements may occupy 20–40% of the composite by volume while the matrix occupy the other 80–60% respectively. The solid reinforcing spheres should ideally have a systematic, hexagonal or face-centered cubic arrangement in the liquid composite matrix to obtain maximum reinforcement. Also, each element should have the same number of neighboring elements, and should be spaced at the same distance from its closest neighbors. As is known in the art, it is impossible to obtain absolute uniformity in the size, weight and density of the reinforcing elements. For example, spherical powder reinforcing elements are made of a range of powders having different sizes, weights, and densities. Hence, only the average size, average weight and average density are of concern.

For illustration, a multi-layered reinforcing element in the form of a spherical powder is described. Specifically, the solid reinforcing spherical powder 20 has an inner spherical core material 21 having an average radius rl, an average volume $v_1=4pr_1^3/3$, an average density $d_1$, and an average weight $w_1=4pd_1r_1^3/3$, where p=pi=3.142. Further, the solid reinforcing spherical powder 20 has an outer solid shell material 22 having an average outer radius $r_2$, a preselected average volume $v_2=4p(r_2^3-r_1^3)/3$, an average density $d_2$, and an average weight $w_2=4pd_2(r_2^3-r_1^3)/3$. The non-segregating principle and technique described herein apply equally, with only obvious modifications, to other shapes of reinforcing elements, such as ellipsoids, plates, or more complicated shapes.

Improved composites are formed when the solid reinforcing non-segregating spherical powders are freely suspended in a liquid composite matrix of density $d_m$. Hence, the liquid composite matrix of volume $v_m$ must have a weight of $w_m$ which is:

$$w_m=4p\ (d_m r_2^3)/3=(v_1+v_2)\ d_m=\text{weight of reinforcing sphere}=4p\ \{d_1 r_1^3/3+d_2(r_2^3-r_1^3)/3\}.$$

Hence, $$d_m r_2^3 = r_1^3\ d_1+d_2\ (r_2^3-r_1^3),\text{ or }r_1^3\ (d_2-d_1)=r_2^3\ (d_2-d_m);$$

and $$r_2/r_1=\{(d_2-d_1)/(d_2-d_m)\}^{(1/3)}.$$

Table 1 is derived from the last equation. To simplify the calculations, one assumes that $Al_2O_3$ is the solid core material with a density of $d_1$ of 3.97 gm/cc, bismuth metal is the solid shell material with a density $d_2$ of 9.75, and that $r_1$ is equal to 1 unit such as 1 micron or 1 mil, and that the liquid composite matrix is made up of 50% by weight indium and 50% by weight tin so as to have a liquid density, $d_m$, of 7.0 gm/cc. According to the last equation, then: $r_={(9.75-3.97)/(9.75-7.0)}^{(1/3)}=1.28$ micron or mil depending on the units used.

As shown in Table 1, the reinforcing spheres are made of a rigid, heat-resistant inner core material 21, which may be any ceramic material including $Al_2O_3$, MgO, SiC, $SiO_2$, $TiO_2$, $SiB_6$, and $ZrO_2$ respectively having densities of 3.97, 3.6, 3.16, 2.33, 4.23, 2.43, and 5.7 gm/cc. Other inner core materials 21 are also useful in the present invention including: calcium oxide and carbon, and metals such as Pb (density 11.4), Au or W (density 19.3), and Ta (density 16.6). Ceramics or hard and refractory metals such as W and Ta are useful core materials for rigidity and heat resistance, while soft metals such as Au and Pb are useful to provide some yielding to relieve thermal or mechanical stresses. Ceramics may be surface plated by electroless or electrolytic methods to coat core or shell materials with W—Fe or Mo—Mn for ceramic metallization, Cu for adhesion and wettability, Ni as diffusion barrier, and Au for surface protection.

With light ceramic cores and a heavy liquid composite matrix, such as 63% Sn-37% Pb with a liquid density $d_m$ of about 8.16, the shell metals must be metals having densities $d_2 > 8.16$ g/cc=$d_m$, such as Au, W, Ta, tungsten carbide (WC), Pb, Mo, Bi, Ag. If a lighter composite matrix, such as 50 w/o In, 50 w/o Sn with a liquid density of about 7.0 as shown above, other lighter metals such as Fe, Ni, Cu, Al, Mg with densities of 7.87, 8.90, 8.9, 2.7, and 1.74 gm/cc, respectively, can also be selected as the shell metals.

The core materials 21 useful in the present invention include: $Al_2O_3$, MgO, SiC, $SiO_2$, $TiO_2$, $SiB_6$, and $ZrO_2$ respectively having densities of 3.97, 3.6, 3.16, 2.33, 4.23, 2.43, and 5.7 gm/cc. The shell material may also be a metal such as Bi, Cd, Au, Fe, Pb, Mo, Ni, Ag, W, and Co, with densities of 9.75, 8.65, 19.3, 7.87, 11.4 10.22, 8.90, 10.5, 19.3, and 8.9 gm/cc, respectively. The 50 w/o In-50 w/o Bi composite matrix has a liquid density of about $d_m$=7.0 g/cc. Hence, the outer shell material 22 of the reinforcing elements must have densities exceeding the liquid composite matrix density, i.e., 7.0 gm/cc to compensates for the lighter ceramic inner core material.

Each of the inner core ceramic material 21 of the solid reinforcing spheres given below has a lower density, $d_1$, than that of the liquid metallic matrix density of the composite, e.g., 7.0 gm/cc. The outer shell material 22 of the reinforcing elements must have a density, $d_2$, which is higher than both the ceramic inner core material density, $d_1$, and the liquid matrix density, of the composite. If the inner core ceramic material 21 has a higher density than that of the liquid composite matrix, the outer shell material 22 must have a density lower than both the inner core material density, $d_1$, and the liquid matrix density of the composite. In general, the outer shell material 22 must have a density $d_2$ which is extrapolated from the inner core material density through the liquid composite matrix density. Specifically, either $d_1 > d_m > d_2$ or $d_1 < d_m < d_2$.

The liquid composite matrix of the composites of the present invention is, for one embodiment, made up of 50% by weight indium and 50% by weight tin and has a liquid density of about 7.0 gm/cc. It is desirable to select the composition of the composite matrix alloy so that its component metals have their liquid densities $d_m$ within 10–20%, or even 5%, of each other or one another, at the composite processing temperature. Other pairs or groups of metals with sufficiently close densities (at the melting point given in parentheses) include: Al (2.38 gm/cc)—Si (2.57 gm/cc), Mo (5.95 gm/cc)—Ga (6.08 gm/cc), Zn (6.21 gm/cc)—Cr (6.3 gm/cc), Co (7.75 gm/cc)—Ni (7.80 gm/cc), Cd (8.0 gm/cc)—Cu (8.02 gm/cc), Ag (9.32 gm/cc)—Mo (9.33 gm/cc), and Bi (10.05 gm/cc)—Pb (10.66 gm/cc).

Hollow reinforcing non-segregating reinforcing spheres are also useful for suspension in a liquid composite matrix of density $d_m$. The production of hollow spheres or ellipsoids will be disclosed later. Here, we simply equate $d_1$=0 in the equation:

$$r_2/r_1 = \{(d_2-d_1)/(d_2-d_m)\}^{(1/3)}.$$

Solid or hollow, reinforcing non-segregating rods or fibers can also be used, with the following formulas for $r_2/r_1$:

$$r_2/r_1 = \{(d_2-d_1)/(d_2-d_m)\}^{(1/2)} \text{ for solid rods, and}$$

$$r_2/r_1 = \{d_2/(d_2-d_m)\}^{(1/2)} \text{ for hollow rods.}$$

For core material 1 of air or vacuum, with a density of nearly zero, the values of $r_2/r_1$ for hollow reinforcing spheres or rods are given in Table 2. The values of $r_2/r_1$, given for different shell metals, are for use in a 63% Sn-37% Pb eutectic tin-lead solder composite having a liquid composite matrix density of $d_m$=9.41 gm/cc. Similar tables for SiC or $Al_2O_3$ reinforcing powders metallic layers in reinforced aluminum or magnesium matrix may also be prepared.

TABLE 1

Values of $r_2/r_1$ Values for two-layered Spheres
$d_m$ = 8.16 gm/cc and $d_1$ = 0
Shell Material 2 Density (gm/cc)

| Core Material 1: Density (gm/cc) | $Al_2O_3$ (3.97) | MgO (3.6) | SiC (3.16) | $SiO_2$ (2.33) | $TiO_2$ (4.23) | $ZrO_2$ (5.7) | $SiB_6$ (2.43) |
|---|---|---|---|---|---|---|---|
| Au (19.3) | 1.11 | 1.12 | 1.13 | 1.15 | 1.11 | 1.07 | 1.14 |
| W (19.3) | 1.11 | 1.12 | 1.13 | 1.15 | 1.11 | 1.07 | 1.14 |
| Ta (16.6) | 1.14 | 1.24 | 1.17 | 1.19 | 1.14 | 1.09 | 1.19 |
| WC (15.3) | 1.10 | 1.28 | 1.19 | 1.22 | 1.16 | 1.10 | 1.22 |
| Pb (11.4) | 1.32 | 1.34 | 1.36 | 1.41 | 1.30 | 1.21 | 1.40 |
| Mo (10.2) | 1.45 | 1.48 | 1.51 | 1.57 | 1.43 | 1.30 | 1.56 |
| Bi (9.75) | 1.54 | 1.57 | 1.61 | 1.67 | 1.66 | 1.37 | 1.66 |

TABLE 2

Values of $r_2/r_1$ for Hollow Reinforcing Elements
$d_m$ = 8.16 gm/cc and $d_1$ = 0

| Shell Material 2 Density (gm/cc) | Reinforcing Elements | |
|---|---|---|
| | Hollow Rod | Hollow Sphere |
| Au (19.3) | 1.30 | 1.19 |
| W (19.3) | 1.30 | 1.19 |
| Ta (16.6) | 1.40 | 1.25 |
| WC (15.3) | 1.46 | 1.29 |
| Pb (11.4) | 1.88 | 1.52 |
| Mo (10.2) | 2.24 | 1.71 |
| Bi (9.75) | 2.48 | 1.83 |

Any materials, whether a single chemical or metal element, ceramic, glass, rock or mineral, plant, animal natural or fossilized bones, or combination of materials in the form of (chemical) compound, 100% chemically bonded, or simply mechanical attached even at a single point only, in any shape, form, or combination can be used as the reinforcing element of this invention. The only requirement is that the density of the single material or combination of materials is close to the density of the liquid composite medium, $d_m$.

Such useful reinforcing materials are indeed many and varied. For the eutectic 63% Sn-37% Pb (density 8.16 g/cc) soldering alloy, these materials range from single metal elements dysprosium Dy (density 8.2), terbium Tb (8.23), niobium Nb (8.57), even iron Fe (7.87) or nickel (8.00); to alloys such as Inconel (8.5), beryllium copper 25 (8.23). Even common minerals such as altaite, SbAs (density) 8.16, sylvanite (Ag,Au)$Te_2$ (8.16), cinnabar HgS (8.17), Stolzite $PbWO_4$ (8.2), (8.2), topaz (8.0), $Ag_2Te$ (8.4), niccolite NiAs (7.77), tantalite (Fe,Mn)(Ta,Nb)$_2O_6$ (7.95), and tapiolite $FeT_2aO_6$ (7.9). After mining and collection, all these minerals can even be used without any treatment except for selecting, surface cleaning, and size reduction. The production cost of these minerals as reinforcing elements is, therefore, very low because processing the mined rocks are simply as follows:

1) mining and collecting;
2) selecting including sorting according to grade;
3) surface cleaning;
4) size reduction; and
5) packaging.

Similar reinforcing materials are available for alloys of aluminum (density about 2.70). These include: augelite $Al_2(PO_4)(OH)3$ (2.70), glauconite $(K,Na,Ca)_{1.6}(Fe,Al, Mg)_{4.0}Si_{7.3}Al_{0.7}O_{20}(OH)_4$, (2.70), thenardite $Na_2SO_4$, (2.7), vaterite $CaCO_3$ (2.71), cordierite $Al_3(MgFe)_2Si_5AlO_{18}$ (2.66), cryolithionite $Na_3Li_3Al_2F_{12}$ (2.77), Glauberite $Na_2Ca(SO_4)_2$ (2.80), $Be_4Si_2O_7(OH)_2$ (2.6), $Be_3Al_2(SiO_3)_6$ (2.64) villiaumite NaF (2.78), sandium Sc (2.80), albite $NaAlSi_3O_8$ (2.63), anorthite $CaAl_2Si_2O_8$ (2.76), $KAlSiO_4$ (2.61), $Al_4Si_4O_{10}(OH)_8$ (2.65), $(La,Ce)_2(CO_3)8H_2O$ (2.72), meiconite $Ca_4Al_6Si_6O_{24}CO_3$ (2.78), $Al_2Si_4O_{10}(OH)_2$ (2.78), agate (2.5–2.7), alabaster carbonate (2.69–2.78), albite (2.62–2.65), basalt (2.4–3.10), beryl (2.69–2.7), biotite (2.7–3.1), calcspar (2.6–2.8), set cement (2.7–3.0), feldspar (2.55–2.75), common glass (2.4–2.8), granite (2.64–2.76), limestone (2.68–2.76), marble (2.6–2.84), mica (2.6–3.2), muscovite (2.76–3.00), porphyry (2.6–2.9), serpentine (2.50–2.65), soapstone (2.6–2.8), talc and (2.7–2.8).

Similaraly, titanium alloys Ti (4.52) can use as reinforcement other minerals such as Yttrium (4.47), Devbylite (4.53), $Sb_2S$ (4.56), Zircon $ZrSiO_{(4.6)}$, Fe7S8 (4.62), $ZnCO_3$ (4.4), $CuFeSn_4$ (4.4), FeS Trolite (4.7), Selenium Se (4.81), $BaSO_4$ (4.49), graphite (4.62), Pansite (4.42) can be used. Alloys of Copper Cu(8.96) can use as reinforcement nickel (8.90) as well as cobalt (8.86), Erbium (9.07), Nickle Ni (8.90), Hastelloy (8.94), monel (8.84), or Holmium (8.80) Pb3)4 (8.9), NiSb (8.7).

In addition, intermetallics also are useful materials. These include: $Ni_3Al$, $FeAl_3$, $FeAl_2$, $Fe_2Al$, $TiAL_3$, $Ti_3Al$, $Cu_2Mg$, $CuMg_2$, $CuSn_3$, $Cu_3Sn$, $Ni_3Sn$, FeCr, $CePd_3$, $ZrAl_3$, $MoSi_2$, ZrPt, and ZrPt. Knowing the atomic weight and density of the combining elements, one can readily calculate the density of these intermetallic compounds. If the calculated density is close to, or within 2–10% of the liquid composite matrix density, $d_m$, then a good selection is made for producing the non-segregating reinforcing elements for the particular liquid composite matrix metal. As is usual, minor adjustments in density may be required to better the density match, or even desirable to provide special properties as to oxidation, corrosion, erosion, friction, magnetism, intermetallic diffusion, . . . , as disclosed elsewhere in this specification. Mo—Mn or W—Fe metallizing layers are useful to improve the wetting properties on the ceramic surface. Even thin or very thin solution metallizing-brazing layers are often desirable, as per Li's patent applications Ser. Nos. 08/301,582 and 08/482,199.

Alloys of other metals such as carbon steel (density 7.2–7.3), cast steel (7.2–7.3), cast iron (7.86–9), titanium (about 4.54), brass (8.47–8.75), nickel (about 8.9), copper (about 8.96), gold (about 19.3), lead (about 11.4), magnesium (about 1.74), molybdenum (about 10.2), silver (about 10.5), tantalum (about 16.6), tungsten (about 19.3), and zinc (about 7.13) can be similarly reinforced with low-cost non-segregating materials of this invention.

Ferromagnetic materials such as iron may be intentionally added to the reinforcing elements, either at the surface or in the interior, to provide magnetic properties. Magnetic properties are useful if the reinforcing elements in the used solder or other bonding alloys are to be recycled. Magnetic used solder particles may be easily separately collected for further treatment such as cleaning, surface material removal by chemicals (e.g., liquid acids or chemical vapors), heat (to melt, evaporate, . . .) or by mechanical abrasion (e.g., brushing, sandpapering, or mixed with sand or SiC in a rotating barrel and fed to a abrasion-roller), and separated from the solder or other bonding alloy for recovery of the used solder and reinforcing elements.

The selection of In-Sn alloy as the composite matrix has a desired effect. The density of liquid indium at its melting point is 7.02 gm/cc, while that of the liquid tin at its melting point is 6.99 gm/cc. The difference in liquid densities is only 0.03 gm/cc or 0.43% at a temperature between the two melting points. The density of this liquid and the solid matrix alloy thus remains substantially constant at about 7.0 gm/cc, even with minor variations in the liquid or solid matrix alloy composition (e.g., +/−10–20% by weight of In) or even with major variations in the liquid or solid matrix alloy composition (e.g., from 0 to 100% by weight of In). This minimizes errors due to material preparation and alloy segregations on freezing.

The radius of the inner core material 21 should generally be less than 500 microns. For example, 20 micron spheres having an $Al_2O_3$ inner core material 21 and a radius of $r_1=10$ microns should be coated with a half-thickness of $(r_2-r_1)$ or 2.8 microns of outer shell or surface coating material 22 of Bi with a $r_2=12.8$ microns for use with the 50%–50% Bi matrix alloy. The outer shell, of the present invention has a thickness of from 1 micron to 1 mm. Such solid spherical reinforcing powders will be stably and uniformly distributed in a liquid composite matrix alloy of 50% by weight of indium and 50% by weight of tin and having a liquid density of about 7.0 gm/cc.

One major difficulty with ceramics is that it is very difficult to obtain strong voidless (100% dense) bonds with any coating material including metals and ceramics. However, my U.S. Pat. Nos. 5,392,982 and 5,230,924, which are incorporated herein by reference, disclose bonding methods which overcome various ceramic bonding problems. Hence, a coating or outer shell metal material 22 on a solid reinforcing element's ceramic inner core 21 can be selectively and voidlessly bonded to both the solid core ceramic material 21 and to the composite matrix to achieve efficient load and heat transfer within each reinforcing element, between neighboring reinforcing elements, and to and from the reinforcing elements across the solid composite matrix. Further, a metallized layer on the ceramic inner core material 21 can form a reliable prime coat onto which other metal layers may be added, if needed. These subsequent metal layers are much more easily applied, i.e., wetted to and bonded onto this properly metallized layer on the ceramic inner core than to the ceramic core itself, thereby improving processing reliability and composite product qualities. This is because metal-metal bonding science is better understood than ceramic-metal bonding. The liquid composite matrix can be the other metal layer which can be voidlessly (at 1000 times magnification) bonded onto the metal 22-coated ceramic core material 21.

The subsequent metal layers may include diffusion barriers formed of refractory metals such as W, Mo, Ta, Cr, Ni, Pt, and other precious metals such as Pd, Os, Re, and the like. Less expensive metals such as Pb, Sn, In, Zn, Cu, and Fe may be used to build up the required weight and density of the solid reinforcing elements. In addition, environmentally protective and temperature-resistant surface layers such as Au, Al, Cr, Ni, Au, and Pt which minimize surface oxidation may be used. The reinforcing element may have one or more core materials, and also one or more shell materials.

Further, unlike electroless or electrolytic plating, plasma spraying, and practically all chemical or physical vapor deposition methods, my methods provide reliable ceramic-metal bonding. The interfacial bonding regions are graded across the interface because of rapid liquid diffusion at the elevated bonding temperatures. A ceramic metallizing composition is used and processed at an elevated ceramic metallizing temperature to be melted into a highly penetrating liquid. The ceramic metallizing liquid also cleans the ceramic surface before metallizing and penetrates deeply into and completely fills the ceramic surface cracks and voids. The ceramic surface defects are thus converted from crack-initiating points into strengthening and toughening reinforcements. Hence, the bonded ceramics can often withstand use temperatures up to 950° C. Such methods are particularly useful for bonding silicon wafers onto an alumina or barilla substrate.

Solid spherical reinforcing powders each containing a solid inner core material and one or more outer shell or surface coating materials in different concentric layers can also be designed and used with equally satisfying results in the present invention. Similar design tables for elongated reinforcing fibers or rods, sheets, weaves, or a combination of these different shapes can also be developed. Various density data is available in CRC Handbook of Chemistry and Physics, D. R. Lide, Ed. In Chief, CRC Press, NY 1996 which is incorporated herein by reference.

Figure 4:
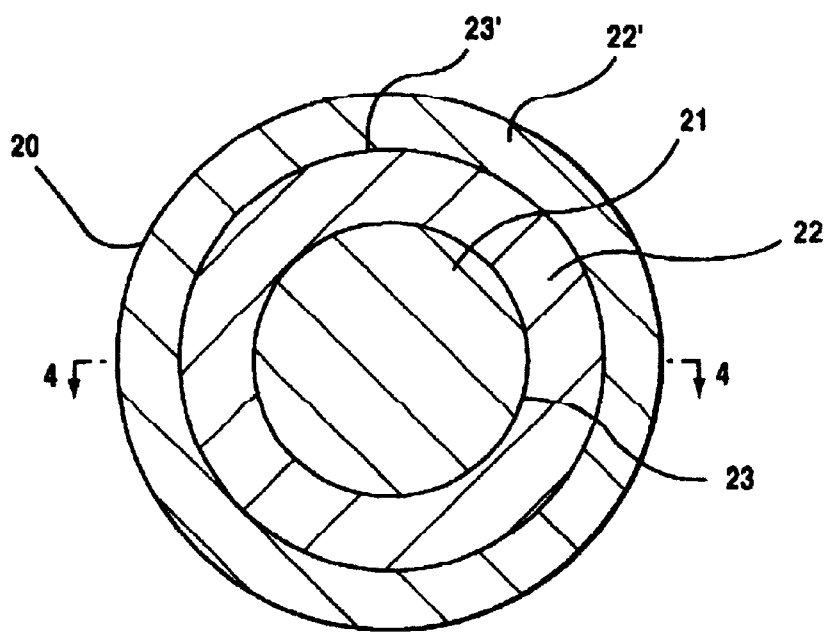
FIG. 4 is a cross-sectional view, of a further embodiment of a non-segregating solid reinforcing element of the present invention.

FIG. 4 shows a cross-section of another non-segregating reinforcing element, 20. As shown, the reinforcing element has an inner core material 21, surrounded by an outer shell material 22. An interface 23 is formed between the inner core material 21 and the outer shell material 22. An additional outer shell material 22' surrounds the outer shell material 22 to minimize metal diffusion or surface oxidation. An interface 23' is formed between the outer shell materials 22 and 23.

Materials other than the above ceramics, including metals, glass, or intermetallic compounds, can also be used in the present invention as the inner core material 21 of the solid reinforcing elements. In many cases, ceramics can also be used as the outer shell or surface coating material 22. Ceramics are insulators but are particularly useful because of their refractory properties, hardness, and their ability to fuiction as diffusion barriers.

Those skilled in the art are aware that certain modifications may be necessary due, for example, to the lack or inaccuracy of available density data. Specifically, the CRC Handbook provides density values only for laboratory pure metals, not practical metals containing impurities. Indium has a density of 7.02 gm/cc at its melting point of 156.6° C., while tin has a density of 6.99 gm/cc at its melting point of 231.9° C. Hence, the 50% by weight In-50% by weight Sn melted alloy for the composite matrix at the composite processing temperature is considered to have a liquid density of about 7.00 gm/cc. Further, the densities of the outer shell or surface coating materials 22, such as Bi, Cd, Co, Au, Fe, Pb, Mo, Ni, Ag, and W are given in the Handbook, but only at 20° C. and not at the actual composite processing temperature. Hence, a few simple experiments in some cases may be needed for precision results.

However, composites designed according to the above parameters give substantially uniform distribution of the suspended solid reinforcing spheres in the liquid 50% by weight In-50% by weight Sn composite matrix. For still better distribution results, the skilled person can perform a few simple tests to determine improved $r_2/r_1$ values. In addition, when more precise and comprehensive density data for impure metals at various composite processing temperatures become available, the skilled person can even replace the estimated density values used in the above table with the exact values by a revised calculation using the improved density data but still according to the formula given above.

Other factors which may require consideration by the skilled artisan in practicing the present invention include the interaction and interdiffusion between the different materials, new phase formations with their associated volume and density changes. Also to be considered are solidification effects due to, e.g., freezing solute segregation according to the phase diagram, and other temperature effects including those due to solute segregation arising from freezing temperature gradients. Yet another factor to consider is that the liquid composite matrix is an alloy rather than a pure metal. When an alloy continuously undergoes freezing, the solute segregates and the liquid density changes, according to its phase diagram. Further, liquid density generally decreases with increasing temperature.

Eutectic alloys, e.g., 63% Sn/37% Pb by weight in the Sn-Pb binary system, are particularly useful in the present invention. Each simple eutectic alloy has the lowest melting point for the entire alloy system, lowering the alloy freezing and composite processing temperature. The eutectic also freezes at its singular melting point, rather than in a freezing range of temperatures for non-eutectic alloys. Further, during freezing, non-eutectic alloys continuously changes temperature, compositions, and densities. In contrast, the eutectic alloy always freezes out at one singular composition (i.e., eutectic composition) at one singular temperature (i.e., eutectic temperature) with, therefore, one singular liquid density. These features eliminate or minimize changes in the liquid composite density due to variations in freezing temperatures and alloy compositions, freezing solute segregations according to the phase diagram, and freezing temperature gradients leading to added changes in liquid composition, composition gradients, and densities. A composite matrix alloy having a eutectic composition or nearly eutectic composition will, therefore, greatly simplify the control of the matrix density and, therefore, the substantially uniform distribution of the solid reinforcing elements therein.

Figure 3:
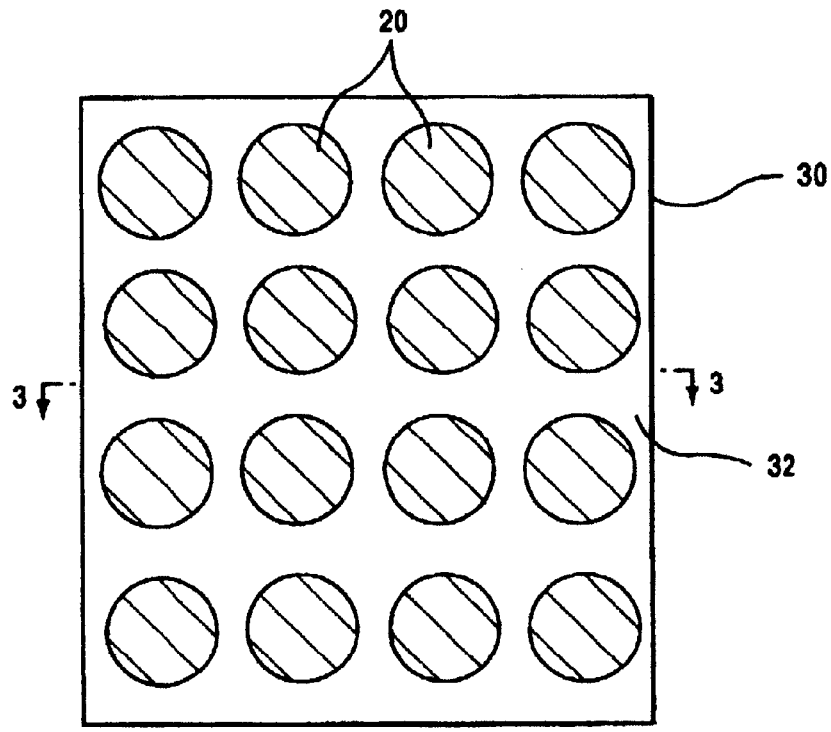
FIG. 3 is a side vertical cross sectional view of an improved composite which is reinforced with a plurality of uniformly distributed, non-segregating reinforcing elements of the present invention.
Figure 5:
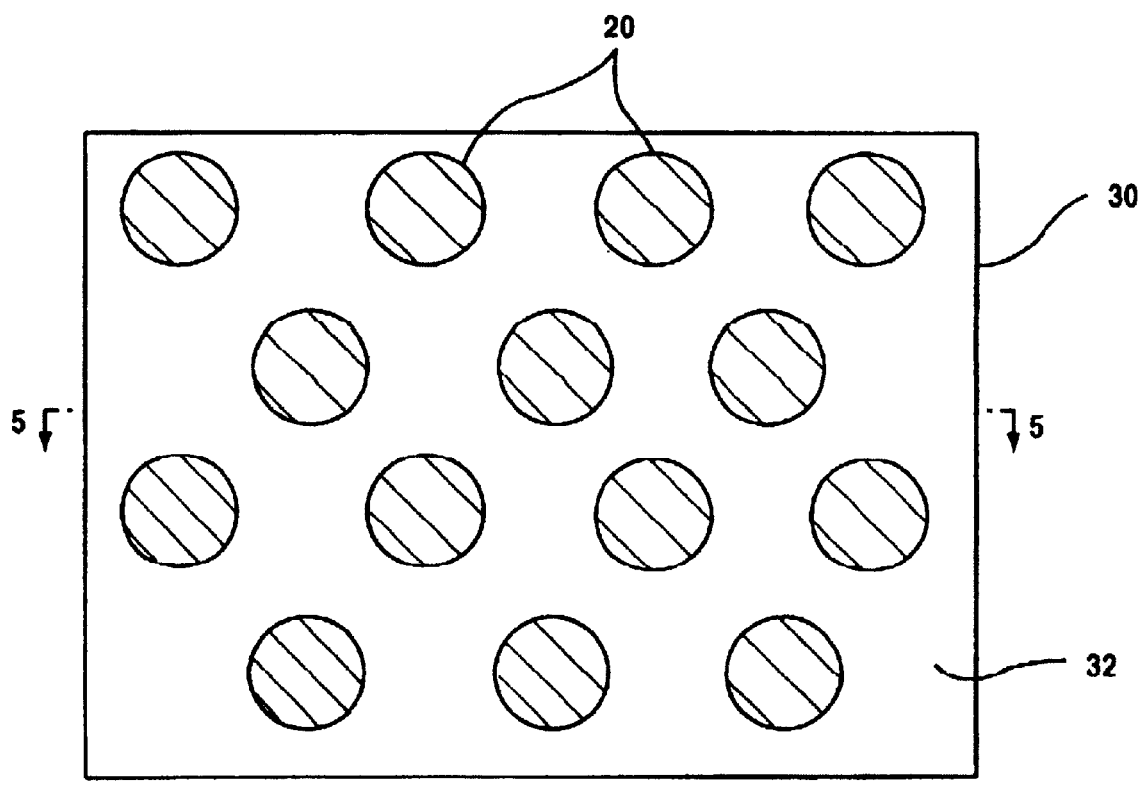
FIG. 5 is a side vertical cross sectional view of a further embodiment of an improved composite which is reinforced with multiple non-segregating reinforcing elements of the present invention.

The uniform distribution of reinforcing elements which is achieved in accordance with the present invention is shown in the cross-sectional views of FIGS. 3 and 5, denoted as a whole by reference numeral 30. As shown, the inventive reinforcing elements 20 have a uniform distribution in the composite matrix 32.

The present invention minimizes interdiffusion and interaction among different component materials by using surface layers of inert or high-temperature diffusion barriers of W, Mo, Cr, Ni, Ta, Ti, or even of ceramics such as those given as the core materials 21 listed above. Further, differing composite shape, size, or depth/width ratio (or aspect ratio) affects the temperature profile or gradient during freezing, local accumulation of the settling solid reinforcing elements, or depletion of liquid composite matrix metal, and their associated changes in alloy freezing behaviors. Again, the eutectic matrix alloy with equal or nearly equal density described above is the easiest to control for achieving the substantially uniform distribution of the solid reinforcing elements both in the initial liquid suspension, and in the subsequently solidified composite matrix.

Modifications to the composite structure and the solid reinforcing element design described fall within the scope of the instant invention. For example, the surface layer or layers may uniformly cover the entire outer surface of the solid reinforcing elements, or a heavier metal may be partially coated onto only one side of the solid reinforcing element. In the liquid composite matrix, this partially metal-coated solid reinforcing element will automatically orient itself to locate the heavier, more heavily metal-coated side at the bottom achieving oriented and aligned solid reinforcing elements in the composite matrix.

In addition, the ceramic core of the solid reinforcing element may be surface coated by spraying, dipping, or fluidizing with the usual W-Fe and Mo-Mn ceramic metallizing composition, to be further heated up to 1200° C. for the required fusion metallizing. Diluted metallizing solutions containing both mettallizers (W,Mo) and brazes (Cu, Zn, In, Zn, Ta, Br, Fe, Mn) can produce uniformly covered, adherent metal-bonded thin layers 3 micron to 100 Å with a thickness accuracy to 10–100 Å. See my U.S. patent applications Ser. No. 08/301,582 filed Sep. 7, 1994 and No. 08/482,199 filed Jun. 8, 1995. Further, the shape of solid reinforcing elements is not necessarily limited to simple shapes such as spheres, cylinders, sheets, or weaves. Tiny structures with complicated shapes having a number of these shapes in combination may often be desirable.

The substantially uniformly and stably dispersed solid ceramic reinforcement in the metal matrix now provides heat resistance to the bonds between the metallic electrical lead wires and the metallic layers coated onto the respective selected through holes, even in the presence of the everpresent parts mounting or bonding stresses between the physically attached parts, and metallurgically bonded components that produce thermal mismatch stresses between the metallic electrical lead wires and the wafer or the coated metallic layers in the selected through holes and between these coated metallic layers and the circuit board.

Figure 8:
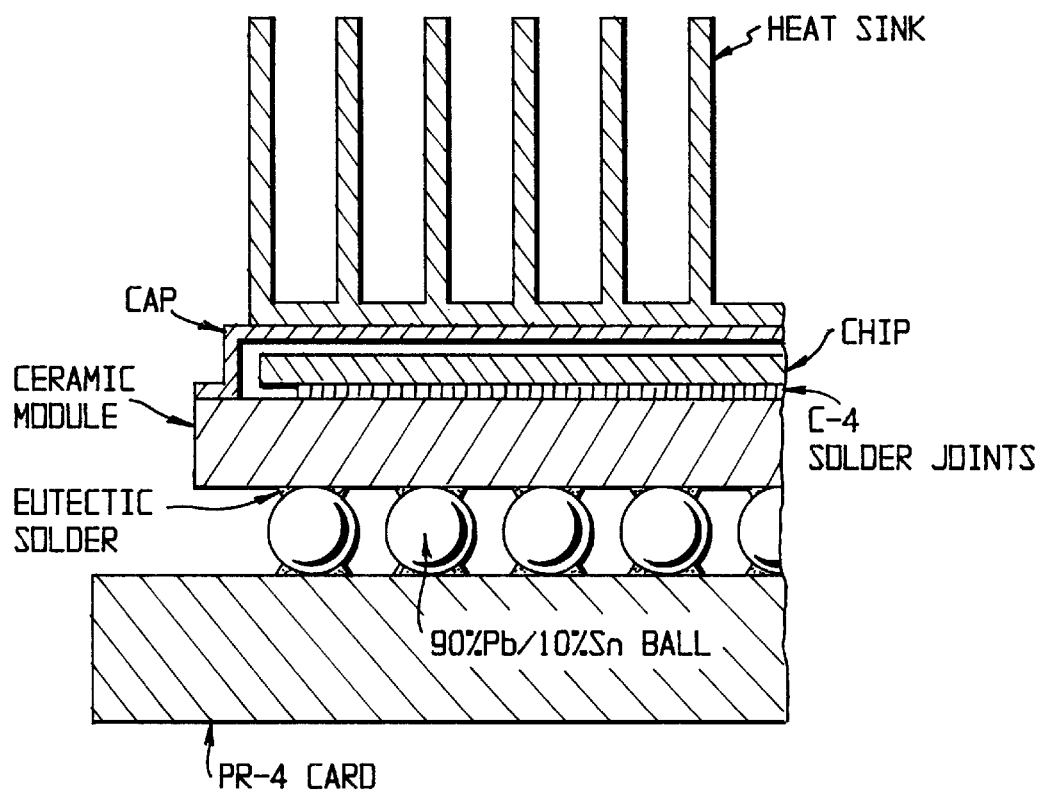
FIGS. 8 and 9 show modem on-chip or off-chip interconnects.
Figure 9:
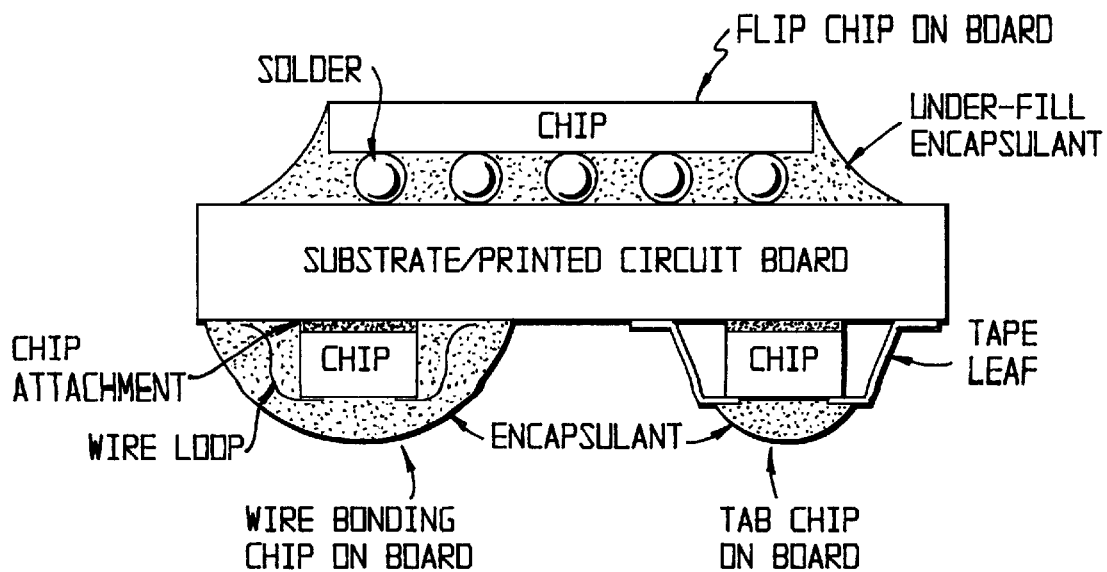

FIGS. 8 and 9 show different methods of modem on-chip and off-chip fusion-bonded, interconnecting methods. These include wafer or chip mounting, on-chip or off-chip interconnecting including wire bonding, surface mounting, and tape automatic bonding (TAB). The new ceramic or plastic ball grid array (BGA) method is particularly attractive.

The tin-lead solders are widely used for low-temperature applications. They are applied as a paste of powders. The particle sizes range from 0.2–0.4 micron in diameter and occupy 10–40% of the composite by weight. Small particles 10–100 nm are also used.

When tin-lead solder melts on the copper pads on the ceramic ($Al_2O_3$) or plastic PR-4 printed circuit board (PCB) substrate, a Cu-Sn intermetallic compound (IMC), i.e., $Cu_6Sn_5$ and $Cu_3Sn$, forms instantly at the interface and serves as the bonding materials between the bulk solder and Cu. The interfacial Cu-Sn IMC layer continues to grow even at room temperature after the solder joint has solidified. The IMC layer increases in thickness with the square of the aging time, according to the law of diffusion.

Cracks initiate and propagate along the IMC/bulk solder interface. There exists a difference of coefficients of thermal expansion (CTE) between the PCB and the components. For example, silicon chip has a CTE of 3 ppm/° C., while most PCB substrate materials, e.g., FR-4 or BT types, have higher expansion coefficients of 13–25 ppm/° C. Ceramic containing 96% $Al_2O_3$ has a CTE of 7 ppm/° C., while metals generally have CTE's of about 10–20 ppm/° C. The CTE mismatch results in a greater shear stress in the solder joints during the temperature change or power cycling, causing thermal fatigue failure of the solder joint. The IMC layer also form cracks that propagate along the IMC interface during the on-off tests.

The formation of IMC layers is minimized by using refractory metal to form a metal diffusion barrier. For example, four weight % of nickel in eutectic tin-lead solder slows the growth of copper-tin IMC, especially the $Cu_3Sn$ growth. Vacuum deposited Cr improves adhesion of the solder onto the PCB. Hence, tin-lead solders often contain other metals such as Cu, Ni, Cr, and Ag.

Severe thermomechanical mismatch stresses also exist in many other cases. The mismatched thermal expansions between surface mount components, the PCB, and supporting frames of the PCB, create thermal fatigue. Fatigue is a very common failure mode of solder joint in electronic components. These properties affect the PCB reliability including moisture resistance, package structure, assembly process, flatness, and coplanarity.

Electronic packages are designed to: (1) provide a path for the electrical current that powers the circuits on the chip, (2) distribute the signals on to and off of the silicon chip, (3) remove the heat generated by the circuit, and (4) support and protect the chip from hostile environments.

Electronic passive components, such as resistors, capacitors, and inductors, are mostly connected to the PCB by threading their lead wires through holes in the PCB and solder-bonding these wires with lead-tin solders. Active semiconductor chips are interconnected by wire bonding and surface mounting. In wire bonding, fine gold or aluminum wires 17–51 microns thick are bonded onto metallized aluminum pads on the chip surface. In various surface mounted methods, the chips are directly solder mounted onto copper pads at designated locations on a substrate surface. See FIGS. 8–9.

In surface-mount tape automated bonding, the chips are mounted on a metallized tape of polyamide with gold bumps at designated locations for bonding. But ceramic or plastic ball grid array surface mounting is quickly becoming the package of choice. In this method, a ceramic or plastic ball grid array assembled in a square package is attached to the PCB with solder balls. Typically, the solder ball diameter and height are 0.75 mm and 0.40 mm, respectively. The silicon die is bonded to a 1.54 mm-thick substrate. After the die attachment and wire bonding, the subassembly is encapsulated.

Advantages of the ball grid array method include: reduced coplanarity problems (no leads), reduced placement problems (self-centering); reduced paste printing problems (bridging); reduced handling issues (no damaged leads); lower profile (smaller size); better electrical performance; better thermal performance; better package yield; better board assembly yield; higher interconnect density; cavity-up or down options; multilayer interconnect options; shorter wire bonds; easier to extend to multichip modules; and faster design-to-production cycle time.

Passive components can also be surface mounted by soldering them onto designated locations on FR-4 PCB using a standard infrared reflow. The solder paste, 150 microns thick, uses a 63Sn-37Pb eutectic alloy (Multicore SN63ABS90). The assemblies are preheated to 100° C. for 100 s and then reflowed inside a three-zone infrared oven. Failures are also due to cracks formed by shear deformation.

All these interconnect methods are useful for other industrial or other heat-resistant equipment. The equipment generally has a frame for mounting, with a significant mounting stress, onto the equipment. A circuit board is rigidly mounted onto the frame at a selected contact area thereof, mechanically by bolts, clamps, and screws. The circuit board has multiple electronic circuit components fusion-bonded onto it. The circuit board consists essentially of a ceramic or plastic board with a top major surface having multiple designated locations for mounting thereon the multiple active or passive electronic components. A fusible metal-matrix solder composite is supplied having a plurality of solid refractory reinforcing elements uniformly and stably dispersed therein for rigidly fusion-bonding the multiple circuit components onto the top major surface of the circuit board at the designated locations. The mounting frame, circuit board, and fusible metal-matrix composite have different CTE's to thereby introduce thermal mismatch stresses at the bonded or contacted areas.

But the uniformly and stably dispersed solid refractory reinforcing elements in the metal-matrix bonding composite provide heat resistance to the fusion bonds between the circuit components and the circuit board, and also between the circuit board and the mounting frame on the equipment, despite a combined presence of the mounting stress and the thermal mismatch stresses between various bonded or mounted materials. This construction makes the equipment frame, the circuit board, and the circuit components heat-resistant.

For improved heat resistance, copper or nickel brazing alloys or even steel weldments may be used to replace the usual low-melting lead-tin solder. The new braze or weldment similarly connects various components onto the circuit board, still with the same non-segregating reinforcing elements of this invention, for further resistance to the resulting equipment.

The liquid composite suspension with the non-segregating reinforcing elements may be cast into a suitable composite mold having a specified internal shape for the liquid composite suspension to freeze therein. The non-segregating liquid composite suspension of, e.g., SiC or $SiB_6$ in Al (density 2.7 g/cc), Mg (density 1.74 g/cc), or Sn-Pb solder, then freezes and assumes the internal shape of the composite mold whereby the solidified solid-reinforced composite has the same shape as the internal shape of the liquid composite mold. Exact-shape or Net-shape heat-resistant products can thus be simply cast at low cost.

Actually, injoining the multiple electrical lead wires onto a PCB, the specified internal shape of the composite mold on the PCB is in the form of a narrow and deep donut-shaped space between an inner cylinder and an internal lead wire generally concentric thereto as shown in FIG. 7. The frozen tin-lead composite is thus a generally cylindrical solid composite tube.

Figure 10:
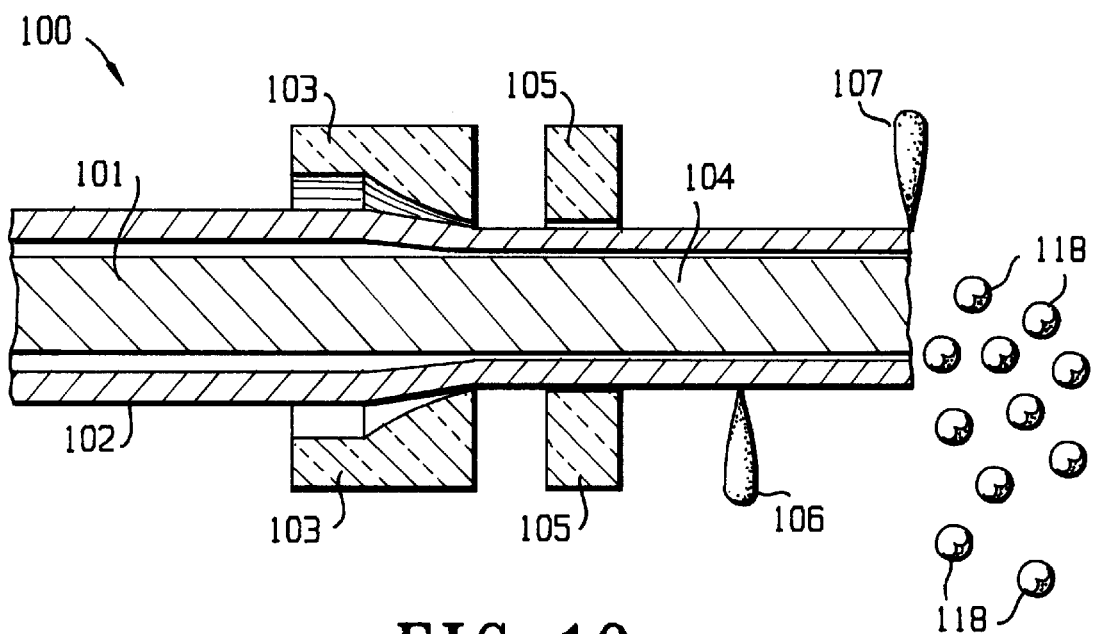
FIG. 10 shows equipment for making solid or hollow reinforcing elements for the new composite.

FIG. 10 shows a process for making hollow reinforcing rods or fibers 100. Here, a inner fine wire 101, less than 50 microns in diameter and of material I, e.g., W, Mo, Ta, Pb, Sn, Fe, Ni, Cu, . . . is inserted into an outer tube 102. The inner surface of the outer tube and/or the outer surface of the inner fine wire may be metal coated or plated for special tribological properties or for protection against the environment. The tube and wire are drawn through wire-drawing dies 103 into a single fine solid wire 104.

If both the core and shell materials are metals, the same fine wire may be made by making by melting an alloy of the metals in the right proportion to form non-segregating reinforcing elements for a particular composite matrix. The molten alloy is then cast into rods, and later drawn down into the fine wire.

For use as reinforcing elements, the solid wire may be flame, laser, or mechanically cut into pieces of the appropriate lengths. This fine wire may also be fed into a gas atomizing system by simply progressively melting the wire fed into the melting zone, to be blown by the gas jet 105 into atomized powders. The atomized powders may be gas classified according to size by simply collecting the powders at different distances from the atomizing nozzle (not shown). The outer surface of the fine wire 100 may be nickel electroless plated for protection and to prevent unwanted metal diffusion.

Actually, the solid wire may be fusion or mechanically cut into the proper length. The ends of the cut pieces may or may not be chemically, mechanically (e.g., by ball milling), or fusion rounded, with the outer surfaces rough or smooth. Tiny reinforcing pieces of any shape, size, and weight can then be had that are always non-segregating in a composite matrix, such as the eutectic Sn—Pb solder melt. The pieces may be spheres, ellipsoids, cubes, octahedrons, dodechedrons, or any regular or irregular polygons, because they all have densities of 8.16 g/cc, the density of the eutectic Sn—Pb solder.

Electrolytic plating of lead, tin, or lead-tin alloys are readily available. For lead plating, one uses a plating bath containing lead (from lead flouborate 109 g/l(iter), free fluoboric acid 100–200 g/l, with a pure lead anode, at 24–34° C. and 32.2–64.5 amperes/cm$^2$. For 60% tin-40% lead (by weight) plating, one uses a bath containing stannous tin (from flurborate) 52 g/l, lead (from fluoborate) 30 g/l, free fluoboric acid 100–200 g/l, with a 60% tin-40% lead anode, at 16–38° C. 19.5 amperes/cm$^2$, and a anode/cathode area ratio of 2:1.

A suitable electroless plating solution comprises about 45 (g/liter) nickel sulfate, 10 sodium hypophosphate, 40 aminoacetic acid, and 10 acetic acid, and has a pH value of 4.5–5.5 for plating at 88–95° C. at 25 microns/hr. Other electroless or electrolytic plating processes for Cu, Au, Ag, Pd, Cr, Sn, and other metal are also available. In addition, electroplating of the same metals are also readily available commercially.

With a density of only 2.43 g/cc, a 1-micron $SiB_6$ sphere has a volume of 0.524 cubic microns, weighs $1.27 \times 10^{-12}$ grams. Table 1 shows that to be non-segregating in 63% Sn-37% Pb having a density of 8.16 g/cc, the 1-micron $SiB_6$ sphere must be built up to 1.19-micron Ta-covered sphere weighing a total of $7.22 \times 10^{-12}$ grams, or a 1.40-micron Pb-covered sphere (Pb surface flash-coated with Ni to prevent solution of Pb in the solder matrix) weighing a total of $11.7 \times 10^{-12}$ grams.

The added $5.95 \times 10^{-12}$ grams of Ta or $10.41 \times 10^{-12}$ grams of Pb forms the outer shell of diameter 1.19 or 1.40 microns, respectively for the Ta or Pb surface covering. Simply attaching the same weight of Ta or Pb onto the 1-micron $SiB_6$ sphere will also make it non-segregating in the liquid solder. The 1.4-micron Pb-covered $SiB_6$ reinforcing sphere has a circumference of 4.40 microns. Simply wrapping around the 1.40-micron Pb-ceramic sphere in a 4.0×4.0 (<4.40) microns square piece of Pb having a thickness to weigh $10.41 \times 10^{-12}$ grams, or in a 5.0×5.0 (>4.40) microns square piece of Pb having a thickness to weigh $10.41 \times 10^{-12}$ grams, without chemical bonding makes the wrapped sphere non-segregating. The ceramic sphere wrapped in the 4.0×4.0 microns square metal piece will have the top surface partially exposed and will suspend without segregation in the solder melt with the lighter top partially exposed surface always pointing upward. The ceramic sphere wrapped in the 5.0×5.0 microns square metal piece will have the top surface multiply covered and will suspend without segregation in the solder melt with the heavier top multiply covered surface always pointing downward. This is another way to achieve nonsegregating reinforcing elements with an oriented anisotropy in weight, mechanical, thermal, and electrical properties.

Figure 11:
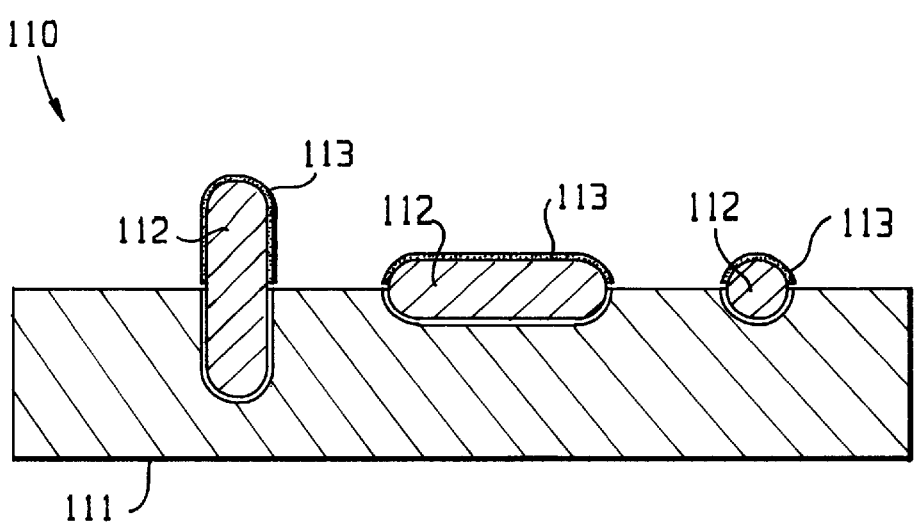
FIG. 11 shows a mold for selectively plating or coating the surface of solid or hollow reinforcing elements for the new composite.

FIG. 11 is a plastic mold 110 of insulating plastic material 111. The top surface of the mold has many semispherical cavities 113, ellipsoidal cavities 114 and cylindrical cavities 115, respectively for holding spheres 116 or round-ended rods 117. As shown, the bottom half halves of the spheres or rods are placed in the cavities, leaving their top halves exposed for plating or coating with metal 118. Depending on the required $r_2/r_1$ values, the partially plated reinforcing spheres or rods may be further plated, e.g., electrolytically in a barrel as per conventional plating practices. The final plated spheres or rods vary in plated thickness from one side or end to the other to achieve oriented anisotropic effects in mechanical, thermal, and electrical properties, both in the plated spheres or rods and also in the resultant composites.

The plastic mold 110 is useful to cast the liquid reinforced composite alloy into semispheres, semiellipsoids, or cylindrical rods. Another similar put upside-down on top of plastic mold 110 then forms a complete mold for casting complete spheres, ellipsoids, or long cylindrical rods. If suitable gates are provided to allow introducing liquid composite suspension into these molds, these special shapes can be precision exact-shape formed by casting.

Spherical hollow metal powders or rods can be made by various methods. One method comprises:

1) supplying a fine core wire 101 of, e.g., Pb, W, Mo, and Ta (all having density greater than 9.41 g/cc), and a larger-size tube of shell metal 102, such as Fe, Cu, Ni, and Ag, or even ceramic (density less than 9.41 g/cc) in paste form. The wire outside diameter is sufficiently smaller than the inside diameter of the tube 102 to allow step 2). The wire size and the tube wall thickness should meet the required $r_2/r_1$ values. Various metal or ceramic wires and tubes are commercially available;

2) slipping the wire 101 inside the tube 102;

3) wire-drawing with drawing die 103 the tube-wire combination to secure intimate contact between the shell material 102 and core material 101 to form a bonded wire 104;

4) with a wire-feeder 105, feeding the drawn wire 104 into a first, forward gas torch, laser, or radiation heating zone 107 to melt, cut, and spherodize at the front end of the wire 104; and with a second rearward, gas torch, laser, or radiation heating zone 108 to melt at another place rearward along the wire 104 to melt, cut, and spherodize the rear end of the cut piece. The distance between the two gas torches (or other melting devices), in combination with the timing and temperature of the melt, determines whether the cut pieces are spheres or rods. The forward torch 107 preferably is also a periodic high-pressure gas atomizing nozzle to atomize the cut and separated molten globule into many finer spheres or rod particles 109. If the forward torch is not a high-pressure gas nozzle, a separate high-pressure gas nozzle must be used 5) the atomized particles can be gas-classified, the coarser particles settling near the gas torch 107 while the finer particles settling in more forward positions. Alternately, the particles may be water-classified, or screened and separated to different sizes;

6) the sized particles may be coated with additional metals such as Ni as diffusion limiter, Au for surface protection, Ag and Cu for thermal or electrical conductivity, and other metals for final weight and $r_2/r_1$ adjustments; and 7) the sized particles may be preferentially metal-plated or surface-coated in the plating mold 110 with e.g., chemically plated or physically coated metal layers at designated places in the plating mold base 111. In FIG. 11, the plating or coating is preferentially made on the top half of a sphere (113), top half of a round-ended rod (116), or top half of a rod (115) to achieve special oriented mechanical, thermal, and electrical effects to be shown elsewhere;

8) the sized particles from the atomizer 100, or the partially plated or coated particles from the plating mold 110, may be firther plated to perform final weight and $r_2/r_1$ adjustments; and 9) suitably controlling the temperature and position, and gas pressure of the gas torches 107 and 108 in the preferential plating equipment of FIG. 11 permits control of the wall thickness on each sphere or rod particle. In this way, the particle can be thicker or thinner in the plated metal at, e.g., the top than at the bottom. When suspended in the liquid composite matrix, these variable wall-thickness particles will be uniformly and stably distributed but will be preferentially oriented so that the thicker wall portions will be at the bottom.

Another method of making the tiny particles comprises using solid plastic foam balls or foam rods of nearly zero density. The surfaces of these balls or rods are chemically or physically coated with a metal selected from Table 2. Additional electrolytic plating may be employed to achieve the required metal thickness $r_2-r_1$.

Instead of plastic foam parts, balls or rods of wax, plastic, or other evaporative solids may be first plated or sprayed with a thin metal layer of a thickness sufficient to make each hollow powder or rod self-standing but insufficient to prevent the loss of the evaporative solid from within the coated metal shell when the hollow ball or rod is heated up. The evaporative solid is removed by heating, burning, and/or vaporization. After the removal of the evaporative solid, the hollow ball or rod is further metal-coated to the required metal thickness $r_2-r_1$. This is a modified lost-wax process used widely in the casting of metals. Tiny wax or heat-sealable plastic wire may also be used to be cut into pieces and flame spherodized or ends-rounded respectively into spheres or rods.

In Detroit, Mich., the tall chimneys of big power plants continuously blow out fused coal ashes. The ashes are emitted as tiny hollow spheres (of less than 1 mm in sizes which are suitable for use in the present invention. The emitted molten ash bubbles are solidified and carried along the wind direction, finally settling down to float on the water of nearby lakes. Further, depending on their sizes, the ash bubbles are classified by wind according to size. The larger the ash bubbles, the closer to the chimney. On these hollow ash balls, the shell metals of Table 2 may be coated to the desired thickness $r_2-r_1$ by electroless plating, electroless plating, or both. Wind-blown coal ash bubbles are formed based on the same principle as multiple soap bubbles are blown with a wire ring from a soap solution. Hence, instead of soap solution, one may use melted quartz, plastics, and selected coal ash or metal.

A metal (or plastic) bubble blowing machine may be designed comprising: (1) a gas-tight pressurized metal-melting chamber, (2) a ceramic plate with many through holes for the bubbles to initiate therefrom, and (3) a stirring or gas jetting means for coating the molten metal (or plastic) onto the inner side of the holed ceramic plate for the pressurized gas to blow the molten metal out of the through holes as tiny spherical bubbles in a upright or inclined direction. The molten spherical bubbles must be frozen before they touch any solid wall.

The optimal temperature and viscosity of the liquid metal or plastic, the size of the blowing-out through holes in the ceramic plate, and the best gas pressure range for blowing the bubbles can be found after a few simple experiments. Suitably located heaters or cooling gas jets, e.g., at the top or bottom of the ceramic plate can control the freezing time and direction of the molten metal bubbles. The bubbles may be frozen, e.g., in a vertical direction, from the bottom up or vice versa. The bubble wall thickness can also be controlled, by gravity and by controlling cooling, to be thicker or thinner at the top than at the bottom. In the liquid composite matrix, these variable wall-thickness bubbles will be uniformly and stably distributed but will be preferentially oriented so that the thicker wall portions will be at the bottom.

The new composite of this invention can now have reinforcing solid or hollow balls or rods with variable wall thicknesses. The composite now has an anisotropic mechanical property, chemical reaction rates of IMC formation, and thermal or electrical conductivity controllably oriented in a preselected direction.

Specifically, the new composite has variably controlled degree of IMC formation from the top surface to the bottom surface of its reinforcing balls or rods due to, differing grain sizes from the variable cooling rates. The new composite is thus variably reinforced mechanically for, e.g., thermal fatigue and high-temperature resistance. In addition, the composite is also simultaneously reinforced both thermally and electrically, increasing respectively the thermal or electrical conductances by, e.g., at least 30 or 50% as shown elsewhere in this specification. This is especially beneficial in electronic applications. Additionally, as shown above, improved thermal conductance increases both heat dissipation and electrical conductance, further lowering the electronic device or system operating temperature and improving materials strength and device or system performance and life.

The nonsegregating qualities of the new reinforcing elements in the solder matrix ensure uniform solder composition, screening, melting, wetting, and reflow characteristics. Uniformly high solder strength and thermal fatigue resistance are thus assured. More important to device miniaturization, reliable and uniform fine solder or conductive lead metal lines of uniformly minimum thickness, widths, post-bonding cleaning and rework, but maximum thermal and electrical conductance are available. As a result, improved signal integrity, chip packing density, yield, cost, mechanical, electrical and thermal performance, flatness and coplanarity (from PCB to PCB, chip to chip, and location to location on the same chip), and board level reliability are possible, even with very high input/output lead counts on extremely miniaturized devices with multiple metal layers.

Extremely thin layers of highly conductive pure metals such as Cu, Ag, Au, Pd, Pt, Ta, W, Mo, Ni, . . . can be uniformly coated and firmly bonded onto substrates of various metals and ceramics including $Al_2O_3$, BeO, silicon, and diamond. Minimum thickness of 75 microns (3 mil) to 100 Angstrom with thickness controlled to 1,000 or 100 Angstroms is possible. These coating and bonding techniques are disclosed in my patent applications Ser. No. 08/301,582 filed Sep. 7, 1994 and Ser. No. 08/482,199 filed Jun. 8, 1995, incorporated by references in the present application.

Various ceramic or metal balls of core radius $r_1$ can also be surface-coated to shell radius $r_2-r_1$ with another ceramic by the methods given in the methods of the above two applications. Electroless plating comprising chemically reducing metal ions in solution to pure metals has been developed to cover many metals including Au, Ag, Cu, Fe, Ni, Sn, Pt, Pd, . . . . A first reducing solution is coated onto the part followed by a second solution containing the metal ions. The metal ions are reduced by the reducing chemicals in the first solution depositing or plating on the part the reduced metals contained in the reducing solution. Electrolytic plating of these same metals from plating solutions has even longer history of success for a wider range of applicable plated metals. Methods of both electrolytic and electroless plating are given in handbooks on metal finishing and plating.

The uniformly distributed reinforcing metal bubbles, made of the metals given in Table 2, have much higher melting points and are, therefore, much more refractory than the common, low-melting lead-tin solder. They add thermal resistance to the new composite solder. These refractory properties of the new reinforcing elements and the bonding composite are an important feature of this invention.

Conventional soldering composite generally comprises a matrix of the eutectic tin-lead alloy for easy application because of its low melting point. Alone, both lead and tin have low thermal and electrical conductances, as shown elsewhere in this specification. Eutectic alloy generally has even lower thermal and electrical conductances than those of the pure constituent metals. Yet, the solid reinforcing elements used in the soldering alloys, such as silicon carbide or alumina, actually are near thermal and electrical insulators, thereby further reducing the already very low conductances of the solder.

In the new composite of this invention, the reinforcing elements may be either pure and conductive hollow metal powders or rods, or pure metal coated powders or rods. See Tables 2 and 1. Hence, these new composites have good mechanical strength and heat resistance, in addition to good thermal and electrical conductances. High thermal conductivity minimizes localized temperature rises which accelerate metal creep and fatigue, further reduces thermal and electrical conductance, while degrades the chip speed and performance. Electronic applications further require that the composite has high electrical conductivities to minimize voltage drop, power consumption, localized heat generation, electrical resistance to enhance signal speed, or device life and performance, as shown above.

The mechanical, thermal, and electrical properties of the bonding composite are interrelated. They all are highly critical to the life and operation of the electronic or other device. The conventional composite having insulating, low-conductive, but segregating reinforcing elements has all these mechanical, electrical, and thermal problems. The new bonding composite of this invention is designed to solve these problems.

Thermal conductivities of materials used in microelectronic packaging, in W/m.K, include: Pb 34, Sn 63, eutectic 63% Sn-37% Pb, Sn 53, 95% Pb-5% Sn 36, alloy 42 16, aluminum 205, Cu 390, Cu alloy 100–200, Au 320, kovar 17, Ni 90, Mo 138, Pt 69, Ag 418, 7–12, Be 250–370, Si 84, Ta 55, printed circuit board substrate FR-4.2-1, Molding compound 0.6, Epoxy 1.6-2, Air 0.02, $SiO_2$ 1.2, polyamide 0.24, Al 240, 390, W 180, alumina 17–21, $SiB_6$ 9, aluminum nitride 200–230, barilla 250–370, Si 84, PCB FR4 substrate 0.2-1, molding compound 0.6, epoxy 1.6-2, air 0.02.

Electrical resistivities or the reciprocal of conductivities, in microohm-cm, of metals used in microelectronic packaging include: Pb 20.65, Sn 11.5, Cu 1.673, Au 2.19, Ni 6.84, Mo 94.1, Pt 69, 9.83, Be 5.9, Ta 12.4, Al 2.66, W 5.5. The electrical resistivities of most ceramics including alumina, aluminum nitride, barilla, FR4, molding compound, epoxy, and air are all orders of magnitude higher than these pure metals. As with thermal conductivities, the electrical conductivities of metals such as Ta, Ni, Cu, W, Mo, . . . are generally several times greater than the those of the Pb-Sn solder alloys.

Hence, with proper combinations of metallic or nonmetallic core and shell metals such as Ta, W, Mo, Ag, Au, Cu, and Ni for the reinforcing elements, the resultant thermal and electrical conductivities of the final solder or bonding composite have significantly higher, often 30–100% higher, thermal and electrical conductivity than the eutectic 67% Sn-37% Pb or 95% Pb-5% Sn, or other solder composite bonding alloy.

At the 1998 Gorham Advanced Ceramics Conference held at the Atlanta Airport Marriott Hotel in Atlanta, Ga. on Mar. 10–12, 1998, Dr. Sam C. Weaver presented a paper on silicon hexaboride $SiB_6$ used as a composite reinforcement. According to the Weaver's paper (copy of viewgraphs enclosed), $SiB_6$ has a density of 2.43 g/cc, which is 0.27 g/cc or over 11.1% less than that of aluminum (density 2.7 g/cc). Even with this 11% density difference, the Al-$SiB_6$ composite has many properties useful for automotive, computer hard drive, recreation, and nuclear applications.

This Al-SiB6 composite, which clearly shows the importance of non-segregating reinforcing elements, can be used as a bonding composite for many electronic or other applications. However, it is patentably different from Li's non-segregating composite because:

1) The Weaver composite depends on the natural, unique but invariable, density properties of Al and $SiB_6$. My composites are custom-designed and specifically manufactured for each application and make possible any combination of density, hardness, melting point, CTE, oxidation resistance, modulus of elasticity, electrical and thermal conductivity, MOR strength, and thermal shock resistance;

2) As a result of 1) above, my metal matrix and reinforcing elements can be matched in density, e.g., within 2, 5, or 10%, as close to a common density as is needed, or even having the same density. For example, with lead-plated (density 11.4 g/cc) $SiB_6$ (density 2.43 g/cc) reinforcing spheres $d_1$=1-micron in size for use in a liquid 63% Sn-37% Pb solder matrix, a $d_2/d_1$ ratio of 1.65 will make the stably non-segregating Pb—$SiB_6$ spheres to have exactly the same density as that of the liquid Sn-Pb solder matrix, i.e., 8.16 g/cc;

3) Hence, my composite has non-segregating, or substantially non-segregating, reinforcing elements due to 2) above. Weaver's composites will still segregate;

4) Al and $SiB_6$ have fixed thermal, electrical, CTE, mechanical, melting, and other properties. Hence, the Al-$SiB_6$ composite has limited uses with likely non-optimal properties;

5) The Weaver composite has a fixed, narrow melting range of about 660° C., the melting point of aluminum. For uses in the electronic industry, such a high-melting bonding medium will destroy the Pb—Sn solder, the PCB, and even the silicon chip itself. My composite can have melting points varying from below about 240° C., the melting point of 63%Pb-37% Sn soldering alloy, to over 800° C. for welding composites;

6) The metallurgical bonding of Al to the $SiB_6$ particles do not share the 100% dense, crack-free, void-free properties (at 1,000 magnification), high thermal and electrical conductivities, and thermal shock-resistant (to 1,000° C.) of products of my ceramic-metal bonding and coating patents U.S. Pat. Nos. 5,392,982 and 5,230,924;

7) My non-segregating composites may be made to have anisotropic mechanical, chemical, thermal, and electrical effects oriented in a preselected direction, permitting directed localized heat removal;

8) According to Weaver, ceramic $SiB_6$ has an electrical conductivity of 6.5–200 ohm-cm, many times less than that of my reinforcing elements made of metals or metal-plated powders; and 9) My composite bonding layers or conductive lines can be 3 microns down to 1,000 Angstroms thick or wide and accurate to 100 angstroms. This is particularly important in electronics to achieve uniformly miniaturized, thin, light, narrow, but reliable bonding layers or lines that minimize cost and post-bonding cleaning or rework, and maximize thermal and electrical conductances, chip packing density, yield, performance, flatness and coplanarity, and board level reliability, and many other benefits as discussed above.

Potential applications of this invention in various industries include high-temperature automobile sensors and controls, deep-well drilling equipment, jet engines or gas turbines, high-speed processors, cellular phones, and lap-top personal computers. Other applications are high-power microwave systems, power suppliers, and radiation hard equipment.

It will thus be seen that the objects set forth above, and those made apparent from the foregoing description, are efficiently attained. Because certain changes may be made in the foregoing description without departing from the scope of the invention, it is intended that all matters contained in the foregoing description or shown in the accompanying drawings shall be interpreted as illustrative and not in a limiting sense.

While the illustrated embodiments given in this specification employ certain forms of composite design and processing procedures, other embodiments may employ other composite designs to be achieve with other processing procedures. Still other alternatives in the composite designs and procedures are possible. Some techniques are provided for the alterative approaches toward fulfilling the objects of the invention.

It is also to be understood that the following claims are intended to cover all of the generic and specific features of the invention herein described, and all statements of the scope of the invention which, as a matter of language, might be said to fall therebetween.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims. In the claims, means-plus-function clause are intended to cover the structures described herein as performing the recited function and not only structural equivalents but also equivalent structures. Thus although a nail and a screw may not be structural equivalents in that a nail employs a cylindrical surface to secure wooden or other soft material parts together, whereas a screw employs a helical surface, in the environment of fastening parts, a nail and a screw may be equivalent structures.

The following U.S. patents and applications are incorporated by reference in this application:
1. U.S. Pat. No. 5,392,982 by Li;
2. U.S. Pat. No. 5,230,924 by Li;
3. U.S. Pat. No. 3,215,555 by Krey;
4. U.S. Pat. application Ser. No. 08/947,308, 04/11/98 by Li;
5. U.S. Pat. application Ser. No. 08/805,535, 02/25/97 by Li;
6. U.S. Pat. application Ser. No. 08/482,199, 06/08/95 by Li;
7. U.S. Pat. application Ser. No. 08/301,582, 09/07/94 by Li.
8. S. C. Weaver, "Silicon Hexaboride Composite", presented at the Gorham Advanced Ceramic Conference in Atlanta Airport Marriott Hotel, Mar. 10–12, 1998, Atlanta, Ga.

I claim:

1. A method of making a heat-resistant article of manufacture comprising:
   providing a first body of a first solid material having a first exposed surface;
   providing a second body of a second solid material having a second exposed surface;
   contacting said second exposed surface and at least one part of said first exposed surface to form a contact region; and
   supplying a heat-resistant composite at said contact region to fluid diffusion bond the at least one part of said first exposed surface to said second exposed surface at said contact region,
   said composite comprising a composite matrix and a plurality of non-segregating reinforcing elements substantially uniformly dispersed therein.

2. The method as in claim 1 including stably and uniformly distributing said non-segregating reinforcing elements in said composite matrix.

3. The method as in claim 1 including causing said composite to have a thermal conductivity which is significantly higher than that of said composite matrix.

4. The method as in claim 1 including causing said composite to have a thermal conductivity which is at least 30 to 100% higher than that of said composite matrix.

5. The method as in claim 1 including causing said composite to have an anisotropic thermal conductivity with a maximum thermal conductivity oriented in a selected direction.

6. The method as in claim 1 including causing said composite to have an electrical conductivity which is significantly higher than that of said composite matrix.

7. The method as in claim 1 including causing said composite to have an electrical conductivity which is at least 30 to 100% higher than that of said composite matrix.

8. The method as in claim 1 including causing said composite to have an anisotropic electrical conductivity with a maximum electrical conductivity oriented in a selected direction.

9. The method as in claim 1 wherein:
   said reinforcing elements are solid reinforcing elements; and
   at least a majority of said solid reinforcing elements are selected from the group consisting of solid powders, hollow powders, solid fibers rods, sheets, and ellipsoids, hollow fibers, and combinations thereof.

10. The method as in claim 1 wherein:
   said reinforcing elements are solid reinforcing elements;
   said composite matrix is a liquid having a specified density; and
   each of said reinforcing elements has an average density which is substantially equal to said specified density to ensure a stably non-segregating quality of said solid reinforcing elements in said liquid composite matrix thereby forming said solid-reinforced composite in a liquid form.

11. The method as in claim 10 including:
   mixing said solid reinforcing elements in said liquid composite matrix to form said heat-resistant composite in a substantially uniformly distributed liquid suspension; and
   freezing said liquid-suspended solid-reinforced composite in a condition to keep said solid reinforcing elements in a same substantially uniformly distributed form.

12. The method as in claim 11 wherein:
   said composite matrix consists essentially of a metal or an alloy thereof; and
   said solid-reinforced composite is a metal-matrix composite.

13. The method as in claim 1 wherein said first body comprises a first part of an equipment and said second body comprises a second part of said equipment.

14. The method as in claim 13 wherein said composite is a bonding composite which bonds said first body to said second body at the contact region on said equipment.

15. The method as in claim 14 wherein said equipment is selected from the group consisting of computer, jet engine, electronic circuit assembly, instruments, entertainment systems, educational systems, vehicles for transportation, satellite communication systems, instruments, aerospace structures, power supplies, microwave systems, radiation hard equipment and other articles of mass manufacture.

16. A method as in claim 15 wherein:
   said first body has a coefficient of thermal expansion which is at least 100% greater than that of said second body; and
   said equipment is subjected to at least a plurality of thermal cycles over a temperature range of at least 200° C. causing a significant thermal mismatch stress in said composite at said contact region which would fail a conventional solid-reinforced composite with segregated reinforcing elements but is tolerable with the solid-reinforced composite with said substantially non-segregating solid reinforcing elements.

17. The method as in claim 1 further comprising:
   supplying said first body of said first solid material having said first exposed surface thereon;
   supplying said second body of said second solid material having said second exposed surface thereon;
   at least one part of said first exposed surface being in close proximity with said second exposed surface to thereby form said contact reion therebetween; and
   providing a heat-resistant metal matrix composite at said contact region to bond the at least one part of said first exposed surface to said second exposed surface at said contact region;
   said composite comprising a metal composite matrix and a plurality of substantially non-segregating solid reinforcing elements substantially uniformly and stably dispersed therein;

said solid reinforcing elements being of a material selected from the group consisting of ceramic, metal, glass, rock, mineral, intermetallic, and mixture or combination thereof.

18. The method as in claim 1 wherein said heat-resistant article is a heat-resistant equipment comprising:
   rigidly mounting an electronic circuit board to a mounting frame with a significant mounting stress, at a designated contact region on the mounting frame,
   said circuit board consisting essentially of a ceramic or plastic board with a top major surface which has a plurality of designated bonding regions for locating thereat a plurality of electronic circuit components; and
   said rigidly mounting step comprising providing a fusible metal-matrix bonding composite comprising said composite matrix and a plurality of solid reinforcing elements substantially uniformly and stably dispersed in said composite matrix; and including fusion-bonding with said bonding composite said plurality of circuit components onto the top major surface of said circuit board at said designated bonding regions;
   said mounting frame, circuit board, and bonding composite having materials which, among one another, differ significantly in coefficients of thermal expansion to thereby introduce a significant thermal mismatch stress at said bonding or contacting regions;
   said substantially uniformly and stably dispersed, solid reinforcing elements in the bonding composite providing heat resistance to the bonding regions between the circuit components and the circuit board and, despite a combined presence of said mounting stress and said thermal mismatch stresses at said various bonding or contacting regions, making said equipment in its entity including the mounting frame, the circuit board, and the circuit components heat-resistant.

19. The method as in claim 1 wherein said heat-resistant article is a plurality of substantially non-segregating, heat-resistant solid reinforcing elements for suspension in a liquid bonding composite matrix of a preselected liquid density $d_m$ for use in a heat-resistant equipment, said equipment containing a plurality of electronic circuit components mounted or bonded on an electronic circuit board on said equipment, further comprising:
   supplying for each of said plurality of said solid reinforcing elements a respective solid inner core material of a selected shape and having a preselected average volume $v_1$, a preselected average density $d_1$, and a preselected average weight $w_1$;
   providing on each of said respective inner core material a respective solid outer shell material having a preselected average volume $v_2$, a preselected average density $d_2$, and a preselected average weight $w_2$, $d_2$ can be zero for hollow reinforcing elements; and
   adjusting values of $v_2$ and $v_1$ so that each of said reinforcing elements has an average weight $v_1 d_1 + v_2 d_2$ which is substantially equal in weight to that of a volume $v_1 + v_2$ of said liquid bonding composite matrix having said preselected liquid density $d_m$ to thereby achieve a substantially non-segregating quality of said solid reinforcing elements when suspended in said liquid bonding composite matrix, thereby forming a solid-reinforced bonding composite containing said plurality of reinforcing elements substantially uniformly distributed in said composite matrix in a liquid suspension form.

20. The method as in claim 19 including solidifying said liquid bonding composite suspension containing said substantially non-segregating solid reinforcing elements therein under a condition sufficient to achieve said substantially uniform distribution of said solid reinforcing elements in said solidified bonding composite.

21. The method as in claim 20 including:
   providing a composite mold having a specified internal shape for the liquid composite suspension to freeze therein; and
   introducing said liquid composite suspension into said composite mold; and
   solidifying said liquid composite suspension whereby the solidified solid-reinforced composite has a same outer shape as the internal shape of said liquid composite mold.

22. The method as in claim 21 wherein:
   said composite mold has an inner cylindrical wall and containing a core having a solid outer cylindrical surface which is generally concentric to said inner cylindrical wall; and
   including causing said liquid composite suspension to freeze in said composite mold to thereby at least form a frozen, generally cylindrical solid composite tube.

23. The method as in claim 1 wherein said heat-resistant article of manufacture is a heat-resistant metal-matrix composite and comprising:
   supplying a matrix of a metal or an alloy thereof;
   providing a plurality of substantially non-segregating, solid reinforcing elements; and
   stably dispersing the plurality of said reinforcing elements substantially uniformly in said metal matrix to form a metal-matrix composite so that there are no overcrowded or underpopulated reinforcing elements anywhere in a bonding composite preventing premature matrix failures by hot tear, fracture, or creep;
   said non-segregating reinforcing elements consisting essentially of a hard and rigid material significantly more heat-resistant than said composite matrix to thereby make the resultant metal-matrix composite also heat-resistant.

24. The method according to claim 23 including providing a composite mold having a specified internal shape for a liquid composite suspension to freeze therein; and
   introducing said liquid composite suspension into said composite mold to thereby solidify said liquid composite suspension so as to assume the internal shape of said composite mold whereby a solidified solid-reinforced composite has a same outer shape as the internal shape of said liquid composite mold.

25. The method according to claim 24 wherein:
   said composite mold has an inner cylindrical wall and containing a core having a solid outer cylindrical surface which is generally concentric to said inner cylindrical wall; and
   including causing said liquid composite suspension to freeze in said composite mold to thereby at least form a frozen, generally cylindrical solid composite tube.

26. The method as in claim 23 wherein said reinforcing elements are of a material selected from the group consisting of metal, $Al_2O_3$, SiC, $SiB_6$, $SiO_2$, $TiO_2$, MgO, $ZrO_2$, AlN; and
   including causing said reinforcing elements to provide mechanical reinforcement thereby significantly increasing mechanical strength of said metal-matrix composite.

27. The method as in claim 23 including causing said solid reinforcing elements to provide thermal reinforcement thereby significantly increasing thermal conductance of said metal-matrix composite.

28. The method as in claim 23 including causing said solid reinforcing elements to provide electrical reinforcement thereby significantly increasing electrical conductance of said metal-matrix composite.

29. The method as in claim 23 including causing said solid reinforcing elements to provide both mechanical and thermal reinforcement thereby significantly increasing both mechanical strength and thermal conductance of said metal-matrix composite.

30. The method as in claim 23 including causing said solid reinforcing elements to provide mechanical, thermal, and electrical reinforcement thereby significantly increasing mechanical strength, thermal conductance, and electrical conductance of said metal-matrix composite.

31. The method as in claim 23 including causing said solid reinforcing elements to provide reinforcement to the metal-matrix composite thereby significantly improving at least one physical property selected from the group consisting of mechanical property, thermal conductance, electrical conductance, and heat resistance.

32. The method as in claim 31 wherein said at least one physical property is anisotropic and oriented in a selected direction.

33. The method according to claim 23 wherein said solid reinforcing elements consist essentially of a reinforcing material which has a density within 10% of that of said metal matrix in a liquid form; and said metal matrix consists essentially of a lead-free alloy having a melting point no more than about 300° C.

34. The method according to claim 23 wherein:
said solid reinforcing elements consist essentially of a reinforcing material which is selected from the group consisting of a single metal, an alloy of a metal, and a mined or collected mineral or rock not artificially processed except for selecting, sorting sized reduction, surface clearning and packaging.

35. A method of making a heat-resistant article of manufacture having a plurality of component parts thereon; comprising
fusion-bonding at least said plurality of said component parts with a heat-resistant metal-matrix bonding composite having a plurality of substantially non-segregating solid reinforcing elements substantially stably suspended uniformly in a metal or metal alloy matrix thereof; and
causing said solid reinforcing elements to provides a metal-matrix bonding composite with significantly improved mechanical, thermal, or electrical properties.

36. The method as in claim 35 including causing said metal matrix to wet said solid reinforcing elements producing a sufficiently perfect fusion-bonding with no voids visible at 1000 magnification so that said metal-matrix bonding composite can withstand temperatures at or near its melting point, which is a few degrees Centigrade below the melting point of the composite matrix, in addition to repeated thermal cycles of at least 200 degrees Centigrade.

37. The method as in claim 35 wherein said article of manufacture is a semiconductor integrated circuit; and
including causing said metal-matrix bonding composite to provide smaller, thinner, lighter, faster, and more reliable, cost-effective, and heat-resistant semiconductor wafer, chip, device, circuit board, and system.

38. The method as in claim 35 including causing said metal-matrix bonding composite to be so defect-free as to withstand fatigue, creep, shear, and hot tear.

39. The method as in claim 35 wherein said manufactured article is a semiconductor integrated circuit; and
including causing said fusion bonding step to make said circuit smaller, thinner, lighter, faster, and more reliable, cost-effective, and heat-resistant.

40. The method as in claim 35 wherein said manufactured article is a semiconductor integrated circuit; and
said fusion bonding step includes making said metal-matrix bonding composite sufficiently defect-free so as to significantly improve at least one circuit feature selected from the group consisting of device miniaturization and reliability, conductive line width and height, chip planarity and coplanarity, wafer warpage, wafer mounting, on-chip and off-chip interconnect density, and chip to board design.

41. The method as in claim 35 wherein said metal-matrix bonding composite comprises ceramic reinforcing elements; and
said fusion-bonding step comprises converting crack-initiating defects on surfaces of said ceramic reinforcing elements into surface reinforcements thereby improving performance of said article and said metal-matrix bonding composite.

* * * * *